United States Patent
Kobayashi

(10) Patent No.: US 11,695,043 B2
(45) Date of Patent: Jul. 4, 2023

(54) SEMICONDUCTOR DEVICE AND METHOD FOR MANUFACTURING THE SAME

(71) Applicants: Kabushiki Kaisha Toshiba, Tokyo (JP); Toshiba Electronic Devices & Storage Corporation, Tokyo (JP)

(72) Inventor: Kenya Kobayashi, Nonoichi Ishikawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 25 days.

(21) Appl. No.: 16/354,632

(22) Filed: Mar. 15, 2019

(65) Prior Publication Data

US 2020/0075762 A1 Mar. 5, 2020

(30) Foreign Application Priority Data

Aug. 30, 2018 (JP) .................. 2018-161835

(51) Int. Cl.
*H01L 29/10* (2006.01)
*H01L 29/78* (2006.01)
(Continued)

(52) U.S. Cl.
CPC ...... *H01L 29/1083* (2013.01); *H01L 21/3065* (2013.01); *H01L 21/3081* (2013.01);
(Continued)

(58) Field of Classification Search
CPC ....... H01L 2924/00014; H01L 29/7813; H01L 29/66734; H01L 29/1095; H01L 29/4236
See application file for complete search history.

(56) References Cited

U.S. PATENT DOCUMENTS 9,306,056 B2 4/2016 Pattanayak et al.
9,385,196 B2 * 7/2016 Korec ................ H01L 29/0834
(Continued)

FOREIGN PATENT DOCUMENTS

JP 2002-368220 A 12/2002
JP 2008-66694 A 3/2008
(Continued)

OTHER PUBLICATIONS

Wang et al., "Power Trench MOSFET Devices on Metal Substrates", IEEE Electron Device Letters, vol. 29, No. 9, Sep. 2008, pp. 1040-1042.
(Continued)

*Primary Examiner* — Tony Tran
(74) *Attorney, Agent, or Firm* — Allen & Overy LLP

(57) ABSTRACT

According to an embodiment, a semiconductor device includes a first semiconductor region of a first conductivity type, a second semiconductor region of the first conductivity type, a first metal portion, a third semiconductor region of a second conductivity type, a first electrode, a fourth semiconductor region of the second conductivity type, and a second electrode. The first semiconductor region includes a first portion and a second portion. The second semiconductor region is provided on the first semiconductor region. The third semiconductor region is provided on part of the second semiconductor region. The first metal portion is provided in the first semiconductor region. The third semiconductor region is positioned on the first portion. The fourth semiconductor region is provided on another part of the second semiconductor region. The fourth semiconductor region is separated from the third semiconductor region. The fourth semiconductor region is positioned on the second portion.

8 Claims, 18 Drawing Sheets

(51) Int. Cl.
*H01L 23/58* (2006.01)
*H01L 29/417* (2006.01)
*H01L 29/423* (2006.01)
*H01L 27/088* (2006.01)
*H01L 21/8234* (2006.01)
*H01L 21/78* (2006.01)
*H01L 21/3065* (2006.01)
*H01L 21/308* (2006.01)
*H01L 23/367* (2006.01)
*H01L 27/02* (2006.01)
*H01L 29/08* (2006.01)
*H01L 21/324* (2006.01)
*H01L 21/02* (2006.01)
*H01L 21/311* (2006.01)
*H01L 21/285* (2006.01)
*H01L 21/288* (2006.01)
*H02J 7/00* (2006.01)

(52) U.S. Cl.
CPC ...... *H01L 21/78* (2013.01); *H01L 21/823487* (2013.01); *H01L 23/367* (2013.01); *H01L 23/585* (2013.01); *H01L 27/0248* (2013.01); *H01L 27/088* (2013.01); *H01L 29/0847* (2013.01); *H01L 29/1033* (2013.01); *H01L 29/41741* (2013.01); *H01L 29/4236* (2013.01); *H01L 29/7827* (2013.01); *H01L 21/0262* (2013.01); *H01L 21/288* (2013.01); *H01L 21/28568* (2013.01); *H01L 21/31116* (2013.01); *H01L 21/324* (2013.01); *H02J 7/00302* (2020.01); *H02J 7/00306* (2020.01)

(56) References Cited

U.S. PATENT DOCUMENTS

| | | |
|---|---|---|
| 2006/0014400 A1 | 1/2006 | Schulze et al. |
| 2007/0215938 A1 | 9/2007 | Yanagida et al. |
| 2011/0101452 A1 | 5/2011 | Sonsky et al. |
| 2012/0241853 A1* | 9/2012 | Ohta ............... H01L 29/66143 257/331 |
| 2012/0248526 A1 | 10/2012 | Kinzer et al. |
| 2014/0284707 A1* | 9/2014 | Kawamura ......... H01L 29/7813 257/330 |

FOREIGN PATENT DOCUMENTS

| | | | |
|---|---|---|---|
| JP | 2008-140828 A | | 6/2008 |
| JP | 2010087096 | * | 9/2008 |
| JP | 2010087096 A | | 4/2010 |
| JP | 2010-103208 A | | 5/2010 |
| JP | 4701375 B2 | | 6/2011 |
| JP | 5254549 B2 | | 8/2013 |
| JP | 6130415 B2 | | 5/2017 |
| WO | 2005-083775 A1 | | 9/2005 |

OTHER PUBLICATIONS

Wang et al., "Enhanced Electrical and Thermal Properties of Trench Metal-Oxide-Semiconductor Field-Effect Transistor Built on Copper Substrate", IEEE Electron Device Letters, vol. 30, No. 1, Jan. 2009, pp. 61-63.

* cited by examiner

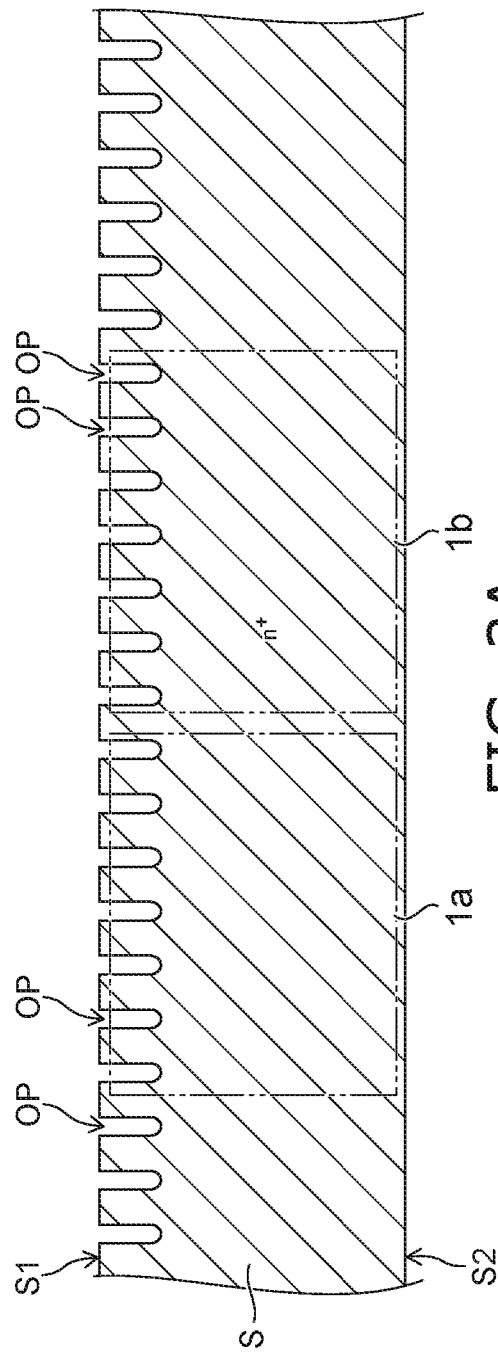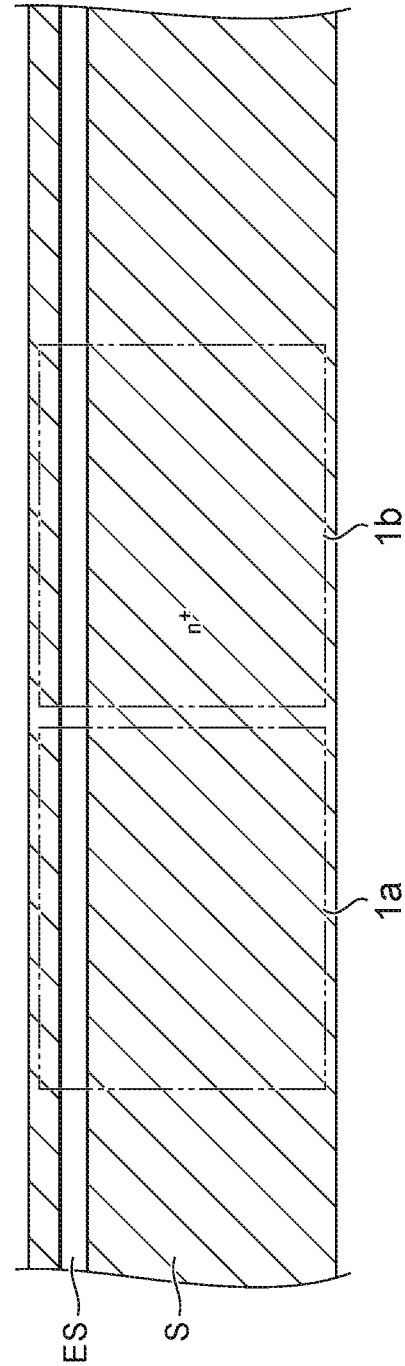

SEMICONDUCTOR DEVICE AND METHOD FOR MANUFACTURING THE SAME

CROSS-REFERENCE TO RELATED APPLICATIONS

This application is based upon and claims the benefit of priority from Japanese Patent Application No. 2018-161835, filed on Aug. 30, 2018; the entire contents of which are incorporated herein by reference.

FIELD

Embodiments described herein relate generally to a semiconductor device and a method for manufacturing the same.

BACKGROUND

A semiconductor device such as a diode, a MOSFET (Metal Oxide Semiconductor Field Effect Transistor), or the like is used in, for example, a protection circuit. It is desirable for the electrical resistance of the semiconductor device to be small.

BRIEF DESCRIPTION OF THE DRAWINGS

FIG. 3A to FIG. 5B are cross-sectional views illustrating manufacturing processes of the semiconductor device according to the first embodiment;

DETAILED DESCRIPTION

Figure 1:
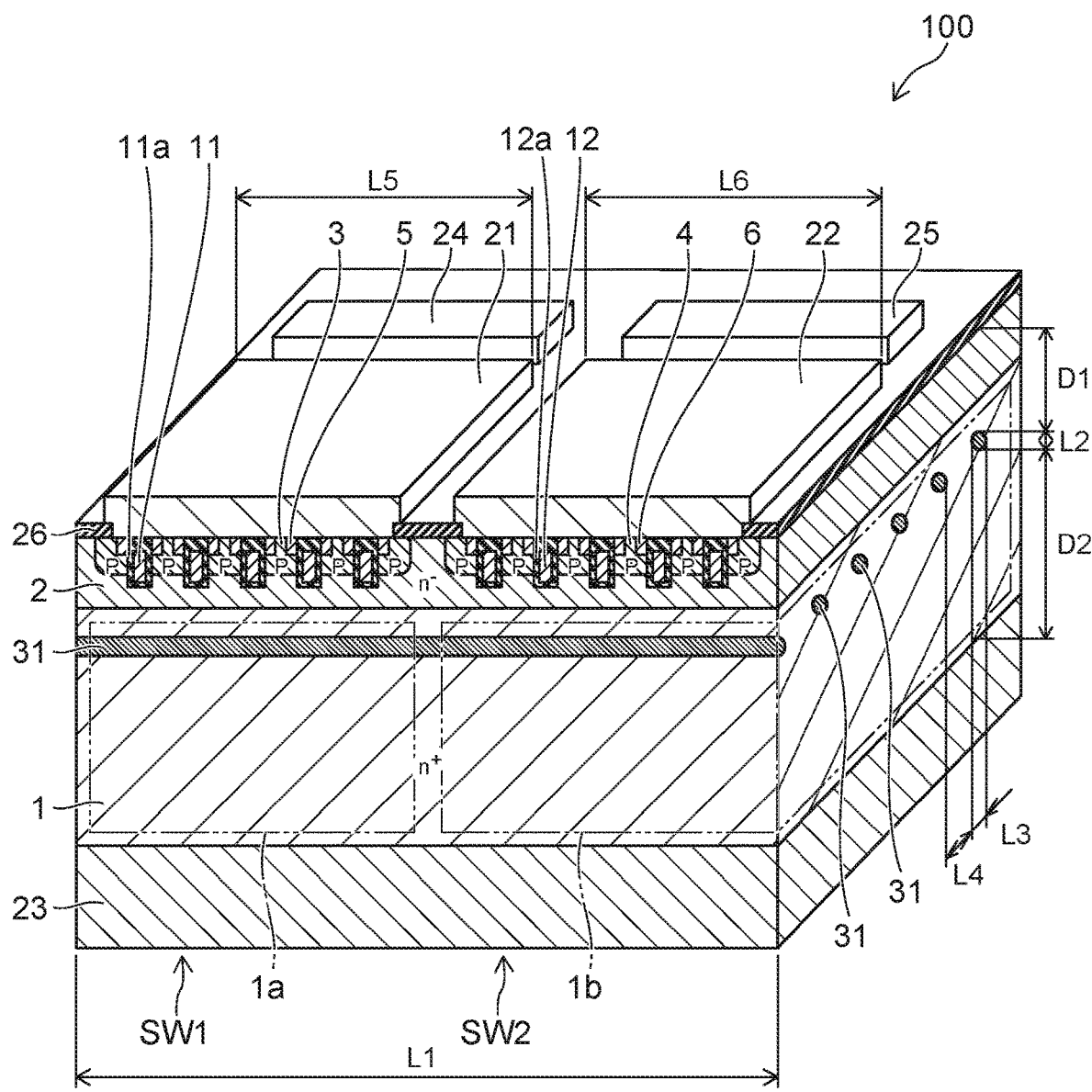
FIG. 1 is a perspective cross-sectional view illustrating a semiconductor device according to a first embodiment.

According to an embodiment, a semiconductor device includes a first semiconductor region, a second semiconductor region, a first metal portion, a third semiconductor region, a first electrode, a fourth semiconductor region, and a second electrode. The first semiconductor region includes a first portion and a second portion. The first semiconductor region is of a first conductivity type. The second portion is arranged with the first portion in a first direction. The second semiconductor region is provided on the first portion and on the second portion. The second semiconductor region is of the first conductivity type. A second direction from the first semiconductor region toward the second semiconductor region is perpendicular to the first direction. An impurity concentration of the first conductivity type in the second semiconductor region is lower than an impurity concentration of the first conductivity type in the first semiconductor region. The first metal portion is provided in the first semiconductor region. A length in the first direction of the first metal portion is longer than a length in the second direction of the first metal portion. The third semiconductor region is provided on a portion of the second semiconductor region. The third semiconductor region is of a second conductivity type. The third semiconductor region is positioned on the first portion. The first electrode is provided on the third semiconductor region. The fourth semiconductor region is provided on another portion of the second semiconductor region. The fourth semiconductor region is of the second conductivity type. The fourth semiconductor region is separated from the third semiconductor region. The fourth semiconductor region is positioned on the second portion. The second electrode is provided on the fourth semiconductor region.

Embodiments of the invention will now be described with reference to the drawings.

The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

In the drawings and the specification of the application, components similar to those described thereinabove are marked with like reference numerals, and a detailed description is omitted as appropriate.

In the following descriptions and drawings, notations of $n^+$, $n^-$ and p represent relative height of an impurity concentration in conductive types. That is, the notation with "+" shows a relatively higher impurity concentration than an impurity concentration for the notation without any of "+" and "−". The notation with "−" shows a relatively lower impurity concentration than the impurity concentration for the notation without any of them. These notations represent relative height of a net impurity concentration after mutual compensation of these impurities when respective regions include both of a p-type impurity and an n-type impurity.

The embodiments described below may be implemented by reversing the p-type and the n-type of the semiconductor regions.

First Embodiment

FIG. 1 is a perspective cross-sectional view illustrating a semiconductor device according to a first embodiment.

The semiconductor device 100 illustrated in FIG. 1 includes an $n^+$-type (a first conductivity type) semiconductor region 1 (a first semiconductor region), an $n^-$-type semiconductor region 2 (a second semiconductor region), a p-type (a second conductivity type) semiconductor region 3 (a third semiconductor region), a p-type semiconductor region 4 (a fourth semiconductor region), an n⁺-type semiconductor region 5 (a fifth semiconductor region), an n⁺-type semiconductor region 6 (a sixth semiconductor region), a gate electrode 11 (a first gate electrode), a gate electrode 12 (a second gate electrode), an upper electrode 21 (a first electrode), an upper electrode 22 (a second electrode), a lower electrode 23 (a third electrode), a gate pad 24, a gate pad 25, and a first metal portion 31.

An XYZ orthogonal coordinate system is used in the description of the embodiments. The direction from the n⁺-type semiconductor region 1 toward the n⁻-type semiconductor region 2 is taken as a Z-direction (a second direction). Two mutually-orthogonal directions perpendicular to the Z-direction are taken as an X-direction (a first direction) and a Y-direction (a third direction). For the description, the direction from the n⁺-type semiconductor region 1 toward the n⁻-type semiconductor region 2 is called "up;" and the reverse direction is called "down." These directions are based on the relative positional relationship between the n⁺-type semiconductor region 1 and the n⁻-type semiconductor region 2 and are independent of the direction of gravity.

The lower electrode 23 is provided at the lower surface of the semiconductor device 100. The n⁺-type semiconductor region 1 is provided on the lower electrode 23 and is electrically connected to the lower electrode 23. The n⁻-type semiconductor region 1 includes a first portion 1a and a second portion 1b. The first portion 1a and the second portion 1b are arranged in the X-direction.

The first metal portion 31 is provided inside the first portion 1a and inside the second portion 1b. The n⁻-type semiconductor region 2 is provided on the first portion 1a and on the second portion 1b. The p-type semiconductor region 3 is provided on a portion of the n⁻-type semiconductor region 2 and is positioned on the first portion 1a. The p-type semiconductor region 4 is provided on another portion of the n⁻-type semiconductor region 2 and is positioned on the second portion 1b. The p-type semiconductor region 4 is separated in the X-direction from the p-type semiconductor region 3. For example, a portion of the n⁻-type semiconductor region 2 is provided between the p-type semiconductor region 3 and the p-type semiconductor region 4.

The n⁺-type semiconductor region 5 is provided on a portion of the p-type semiconductor region 3. The upper electrode 21 is provided on the p-type semiconductor region 3 and the n⁺-type semiconductor region 5 and is electrically connected to the p-type semiconductor region 3 and the n⁺-type semiconductor region 5. The gate electrode 11 opposes the n⁻-type semiconductor region 2, the p-type semiconductor region 3, and the n⁺-type semiconductor region 5 in the X-direction with a gate insulating layer 11a interposed.

The n⁺-type semiconductor region 6 is provided on a portion of the p-type semiconductor region 4. The upper electrode 22 is provided on the p-type semiconductor region 4 and the n⁺-type semiconductor region 6 and is electrically connected to the p-type semiconductor region 4 and the n⁺-type semiconductor region 6. The gate electrode 12 opposes the n⁻-type semiconductor region 2, the p-type semiconductor region 4, and the n⁺-type semiconductor region 6 in the X-direction with a gate insulating layer 12a interposed.

The gate pad 24 and the gate pad 25 are separated from each other and are separated from the upper electrode 21 and the upper electrode 22. The gate pad 24 is electrically connected to the gate electrode 11. The gate pad 25 is electrically connected to the gate electrode 12. An insulating layer 26 is provided around the upper electrode 21, the upper electrode 22, the gate pad 24, and the gate pad 25.

In the semiconductor device 100, a switching element SW1 includes the gate electrode 11, the n⁺-type semiconductor region 5, the p-type semiconductor region 3, and a portion of the n⁻-type semiconductor region 2. A switching element SW2 includes the gate electrode 12, the n⁺-type semiconductor region 6, the p-type semiconductor region 4, and another portion of the n⁻-type semiconductor region 2.

The switching element SW1 and the switching element SW2 are connected in series via the n⁺-type semiconductor region 1 and the lower electrode 23. For example, the upper electrode 21 and the lower electrode 23 are respectively the source and the drain of the switching element SW1. The upper electrode 22 and the lower electrode 23 are respectively the source and the drain of the switching element SW2. The switching element SW1 and the switching element SW2 are connected with mutually-reverse orientations to a common drain.

The p-type semiconductor region 3, the p-type semiconductor region 4, the n⁺-type semiconductor region 5, the n⁺-type semiconductor region 6, the gate electrode 11, and the gate electrode 12 each are multiply provided along the X-direction and extend in the Y-direction. The multiple p-type semiconductor regions 3, the multiple n⁺-type semiconductor regions 5, and the multiple gate electrodes 11 are positioned on the first portion 1a. The multiple p-type semiconductor regions 4, the multiple n⁺-type semiconductor regions 6, and the multiple gate electrodes 12 are positioned on the second portion 1b.

A length L1 in the X-direction of the first metal portion 31 is longer than a length L2 in the Z-direction of the first metal portion 31 and longer than a length L3 in the Y-direction of the first metal portion 31. For example, the length L2 is the same as the length L3.

The first metal portion 31 is multiply provided in the Y-direction. The multiple first metal portions 31 are separated from each other. A portion of the n⁺-type semiconductor region 1 is provided between the first metal portions 31. The length L2 is shorter than a length L4 in the Y-direction of the portion of the n⁺-type semiconductor region 1. The length L4 corresponds to the distance between mutually-adjacent first metal portions 31.

For example, the length L1 is longer than the sum of a length L5 in the X-direction of the upper electrode 21 and a length L6 in the X-direction of the upper electrode 22. A distance D1 between the first metal portion 31 and the upper electrode 21 (or the upper electrode 22) is shorter than a distance D2 between the first metal portion 31 and the lower electrode 23.

Figure 2:
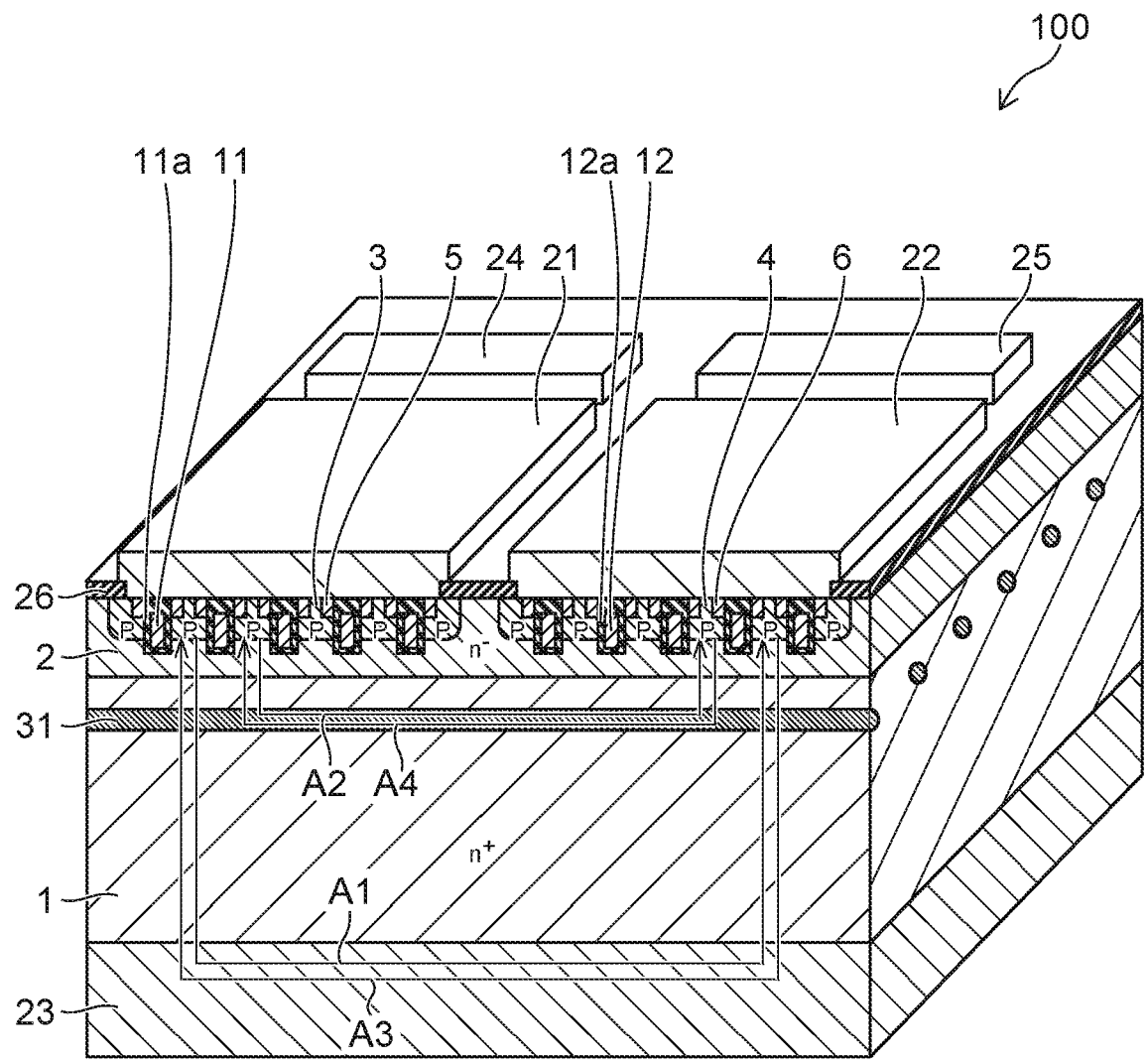
FIG. 2 is a schematic view illustrating operations of the semiconductor device according to the first embodiment.

FIG. 2 is a schematic view illustrating operations of the semiconductor device according to the first embodiment.

For example, a voltage that is positive with respect to the upper electrode 21 is applied to the upper electrode 22. In this state, voltages that are a threshold or more are applied to the gate electrodes 11 and 12. Thereby, channels (inversion layers) are formed in a region of the p-type semiconductor region 3 at the gate insulating layer 11a vicinity and a region of the p-type semiconductor region 4 at the gate insulating layer 12a vicinity. The switching element SW1 and the switching element SW2 are set to the ON-state. As illustrated by arrow A1, a portion of the electrons flow through the channel of the p-type semiconductor region 3 from the upper electrode 21 to the lower electrode 23 and flow through the channel of the p-type semiconductor region 4 from the lower electrode 23 to the upper electrode 22. As illustrated by arrow A2, another portion of the electrons flows through the first metal portion 31 from the upper electrode 21 to the upper electrode 22. Subsequently, when the voltages that are applied to the gate electrodes 11 and 12 become lower than the threshold, the channels of the p-type semiconductor regions 3 and 4 disappear; and the semiconductor device 100 is set to the OFF-state.

A voltage that is positive with respect to the upper electrode 22 may be applied to the upper electrode 21. In such a case, as illustrated by arrow A3, a portion of the electrons flows through the channel of the p-type semiconductor region 4 from the upper electrode 22 to the lower electrode 23 and flows through the channel of the p-type semiconductor region 3 from the lower electrode 23 to the upper electrode 21. As illustrated by arrow A4, another portion of the electrons flows through the first metal portion 31 from the upper electrode 22 to the upper electrode 21.

The $n^+$-type semiconductor region 1, the $n^-$-type semiconductor region 2, the p-type semiconductor region 3, the p-type semiconductor region 4, the $n^+$-type semiconductor region 5, and the $n^+$-type semiconductor region 6 include silicon, silicon carbide, gallium nitride, gallium arsenide, or gallium oxide as a semiconductor material. In the case where silicon is used as the semiconductor material, arsenic, phosphorus, or antimony can be used as the n-type impurity. Boron can be used as the p-type impurity.

The gate electrodes 11 and 12 include an electrically conductive material such as polysilicon, etc. The gate insulating layer 11a, the gate insulating layer 12a, and the insulating layer 26 include an insulating material such as silicon oxide, etc. The upper electrode 21, the upper electrode 22, the lower electrode 23, the gate pad 24, and the gate pad 25 include a metal such as aluminum, nickel, copper, etc. For example, the upper electrode 21, the upper electrode 22, the lower electrode 23, the gate pad 24, and the gate pad 25 include AlSi, AlCu, or AlSiCu.

The first metal portion 31 includes, for example, at least one selected from the group consisting of titanium, nickel, copper, and tungsten. The electrical resistivity of the first metal portion 31 is lower than the electrical resistivity of the $n^+$-type semiconductor region 1.

FIG. 3A to FIG. 5B are cross-sectional views illustrating manufacturing processes of the semiconductor device according to the first embodiment.

First, a semiconductor substrate S is prepared. The semiconductor substrate S is made of an $n^+$-type semiconductor region (the first semiconductor region). The semiconductor substrate S has a first surface S1 and a second surface S2. The semiconductor substrate S includes the first portion 1a and the second portion 1b. As illustrated in FIG. 3A, multiple openings OP are formed in the first surface S1 sides of the first portion 1a and the second portion 1b. The multiple openings OP are arranged in the X-direction. The position of the column of the openings OP arranged in the X-direction corresponds to the position where one first metal portion 31 will be provided. In the case where the first metal portion 31 is multiply provided in the Y-direction, the column of the openings OP is multiply formed in the Y-direction. For example, the openings OP are formed by RIE (Reactive Ion Etching) using a patterned photoresist.

Heat treatment of the semiconductor substrate S is performed in a hydrogen atmosphere. For example, the semiconductor substrate S is heated to 1100° C. for 10 minutes to 30 minutes in a hydrogen atmosphere at 10 Torr. Surface migration of the silicon occurs due to the heat treatment; and the configurations of the multiple openings OP change. Specifically, when the heat treatment is performed, the diameters of the bottom portions of the openings OP increase; and the diameters of the upper portions of the openings OP decrease. As time elapses, the upper portions of the openings OP eventually are plugged; and the bottom portions of the openings OP communicate with each other. As a result, as illustrated in FIG. 3B, a hollow ES that extends in the X-direction inside the semiconductor substrate S is formed.

The $n^-$-type semiconductor region 2 is epitaxially grown on the semiconductor substrate S. The p-type semiconductor region 3 and the p-type semiconductor region 4 are formed on the $n^-$-type semiconductor region 2. The p-type semiconductor region 3 and the p-type semiconductor region 4 are positioned respectively on the first portion 1a and on the second portion 1b. The $n^+$-type semiconductor region 5 and the $n^+$-type semiconductor region 6 are formed respectively on a portion of the p-type semiconductor region 3 and on a portion of the p-type semiconductor region 4. The gate electrode 11 and the gate electrode 12 are formed.

An insulating layer that covers the $n^-$-type semiconductor region 2, the p-type semiconductor region 3, the p-type semiconductor region 4, the $n^+$-type semiconductor region 5, and the $n^+$-type semiconductor region 6 is formed by CVD (Chemical Vapor Deposition). A portion of the insulating layer is removed so that the p-type semiconductor region 3, the p-type semiconductor region 4, the $n^+$-type semiconductor region 5, and the $n^+$-type semiconductor region 6 are exposed. Thereby, the insulating layer 26 that covers the surface of the $n^-$-type semiconductor region 2 between the p-type semiconductor region 3 and the p-type semiconductor region 4 is formed.

Figure 4A:
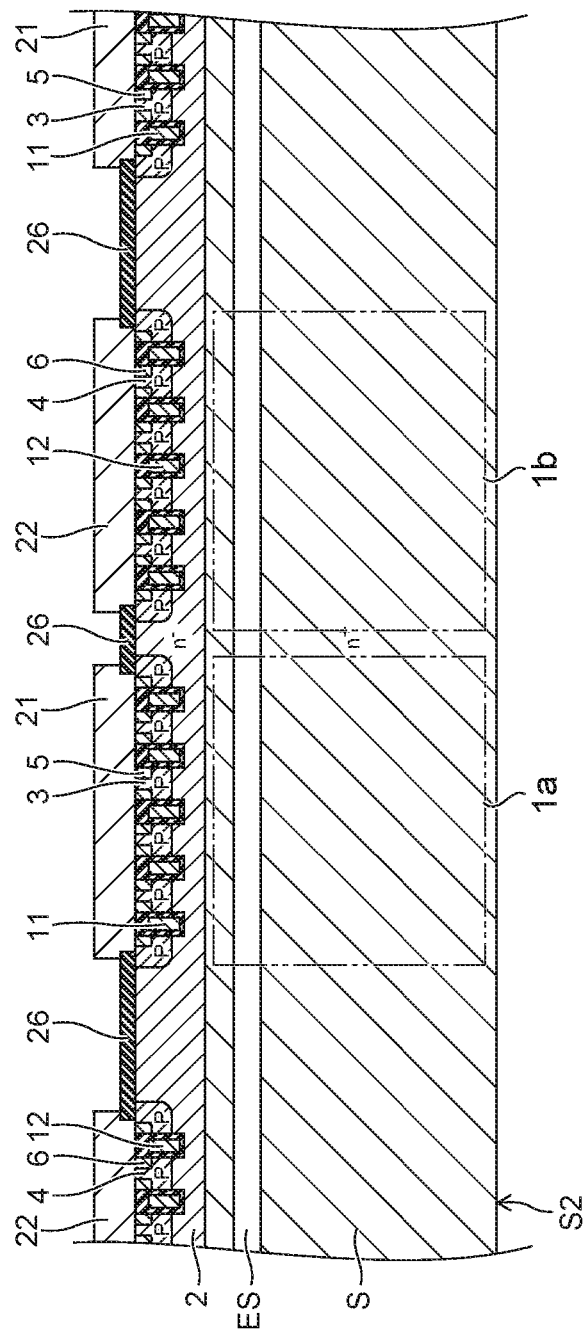

A metal layer that covers the insulating layer 26 is formed by sputtering. As illustrated in FIG. 4A, the upper electrode 21 and the upper electrode 22 are formed respectively on the $n^+$-type semiconductor region 5 and on the $n^+$-type semiconductor region 6 by patterning the metal layer. At this time, the not-illustrated gate pad 24 and the not-illustrated gate pad 25 that are electrically connected respectively to the gate electrode 11 and the gate electrode 12 are formed.

Figure 4B:
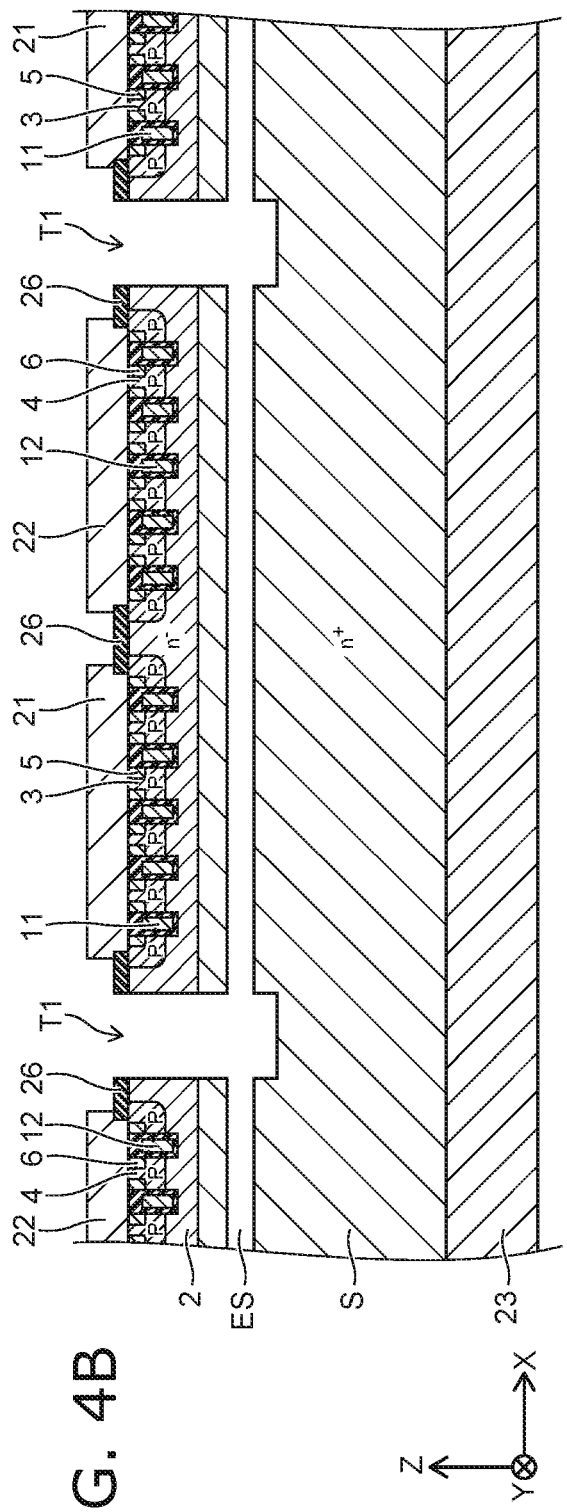

The second surface S2 of the semiconductor substrate S is polished until the semiconductor substrate S has a prescribed thickness. At this time, the semiconductor substrate S is polished so that the hollow ES is not exposed. The lower electrode 23 is formed on the polished second surface S2 of the semiconductor substrate S. A portion of the insulating layer 26 is removed by RIE so that the surface of the $n^-$-type semiconductor region 2 around the p-type semiconductor region 3 and the p-type semiconductor region 4 is exposed. As illustrated in FIG. 4B, a trench T1 is formed around the p-type semiconductor region 3 and the p-type semiconductor region 4 by performing RIE or CDE (Chemical Dry Etching) using the insulating layer 26 as a mask. The trench T1 pierces the $n^-$-type semiconductor region 2, reaches the semiconductor substrate 5, and communicates with the hollow ES.

Figure 5A:
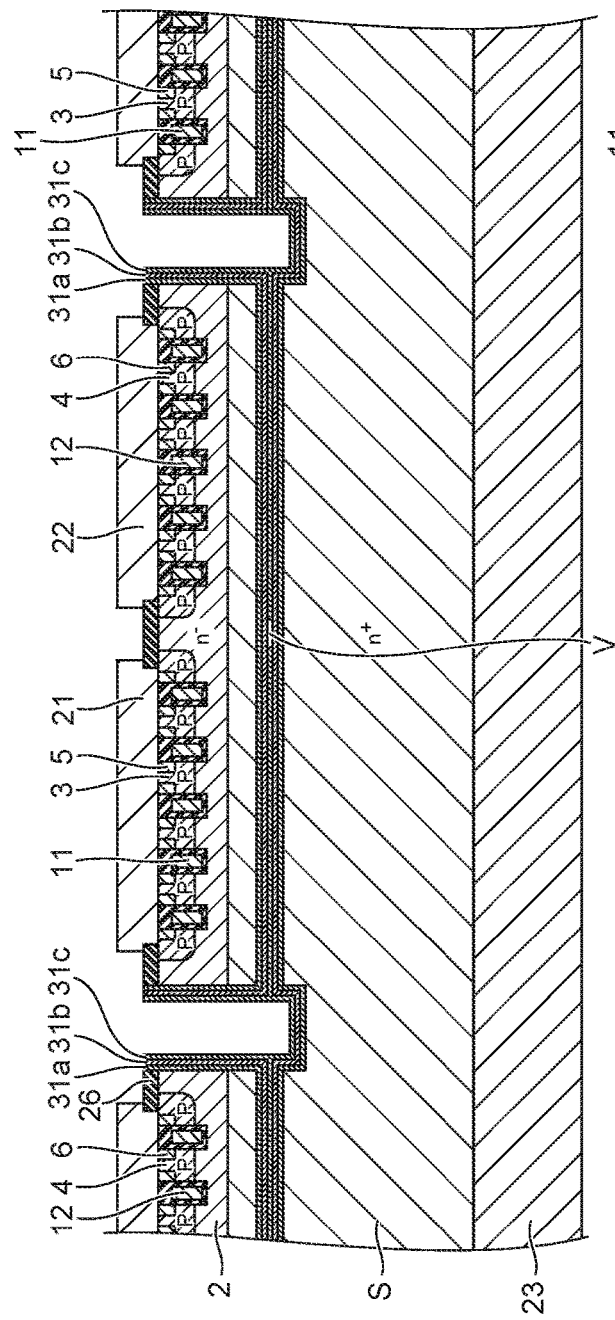

As illustrated in FIG. 5A, a titanium layer 31a, a titanium nitride layer 31b, and a nickel layer 31c are sequentially formed inside the hollow ES through the trench T1. For example, the titanium layer 31a and the titanium nitride layer 31b are formed by CVD. For example, the nickel layer 31c is formed by electroless plating. A nickel layer may be formed on the surfaces of the upper electrode 21, the upper electrode 22, the gate pad 24, and the gate pad 25 when forming the nickel layer 31c. The first metal portion 31 includes the titanium layer 31a, the titanium nitride layer 31b, and the nickel layer 31c provided inside the hollow ES.

As illustrated in FIG. 5A, a void V may be formed inside the first metal portion 31 when forming the first metal portion 31. A copper layer may be formed by electroless plating instead of the nickel layer 31c. Or, a tungsten layer may be formed by CVD instead of the titanium layer 31a, the titanium nitride layer 31b, and the nickel layer 31c.

Figure 5B:
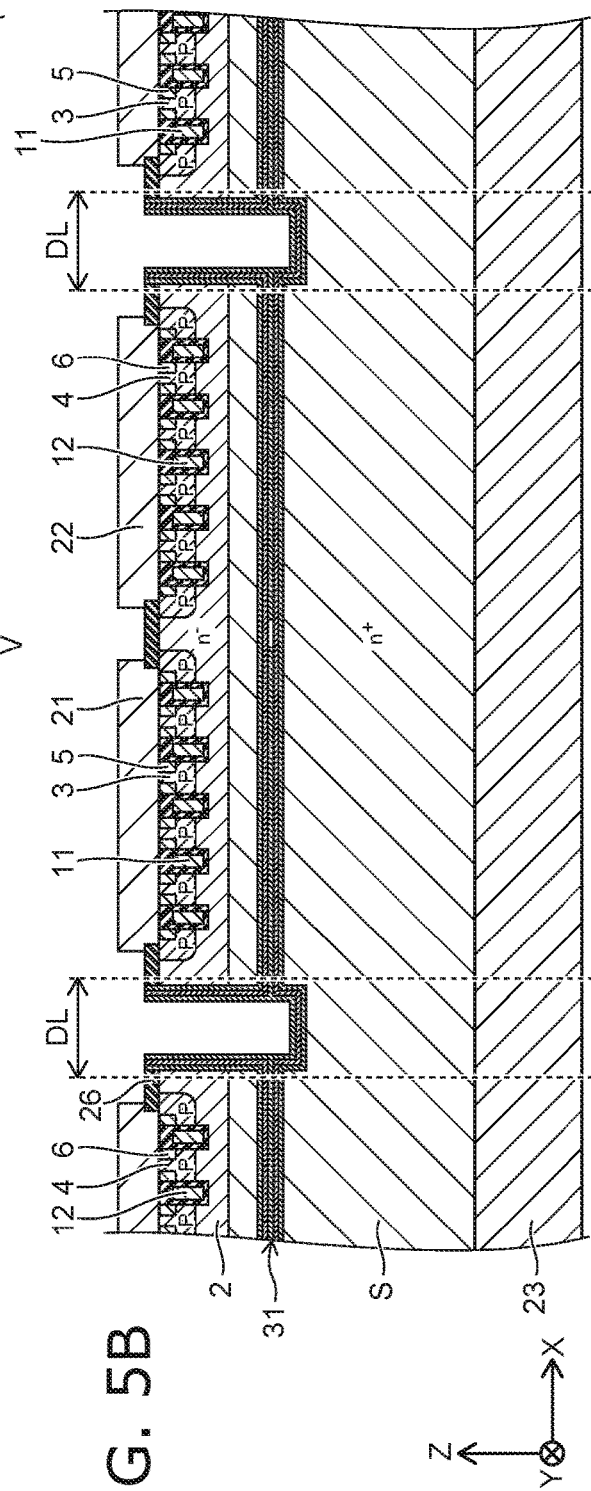

As illustrated in FIG. 5B, the semiconductor substrate S and the n⁻-type semiconductor region 2 are cut along a dicing line DL. For example, the width (the length in the X-direction or the Y-direction) of the dicing line DL is set to be wider than the width of the trench T1. Thereby, the metal layer that is adhered to the side surface of the n⁻-type semiconductor region 2 is removed. Or, the metal layer that is adhered to the inner wall of the trench T1 may be removed before cutting the semiconductor substrate S and the n⁻-type semiconductor region 2. In such a case, the width of the dicing line DL may be narrower than the width of the trench T1.

Effects of the first embodiment will now be described.

The semiconductor device 100 according to the first embodiment includes the first metal portion 31. The first metal portion 31 is provided inside the first portion is and inside the second portion 1b. The first metal portion 31 is positioned under the upper electrode 21 and under the upper electrode 22. When the switching element SW1 and the switching element SW2 are in the ON-state, the carriers (the electrons) flow between the upper electrode 21 and the upper electrode 22. By providing the first metal portion 31, as illustrated in FIG. 2, the carriers (the electrons) travel not only along the paths illustrated by arrows A1 and A3 but also along the paths illustrated by arrows A2 and A4. Therefore, the electrical resistance between the upper electrode 21 and the upper electrode 22 can be reduced. The power consumption of the semiconductor device 100 can be reduced.

It is desirable for the first metal portion 31 to be multiply provided in the Y-direction. By providing the multiple first metal portions 31, the electrical resistance between the upper electrode 21 and the upper electrode 22 can be reduced further.

It is desirable for the length L1 of the first metal portion 31 to be longer than the sum of the length L5 of the upper electrode 21 and the length L6 of the upper electrode 22. According to this configuration, the electrons flow more easily through the first metal portion 31. The electrical resistance between the upper electrode 21 and the upper electrode 22 can be reduced further.

To further reduce the electrical resistance between the upper electrode 21 and the upper electrode 22, it is effective to reduce the thickness in the Z-direction of the n⁺-type semiconductor region 1. In the case where the n⁺-type semiconductor region 1 is thin, the distance between the upper electrode 21 and the lower electrode 23 and the distance between the upper electrode 22 and the lower electrode 23 become short. The lengths of the paths illustrated by arrow A1 and arrow A3 of FIG. 2 can be shorter. However, in such a case, the n⁺-type semiconductor region 1 is thin; and the semiconductor device 100 becomes easy to break. To reduce the electrical resistance while suppressing the damage to the semiconductor device 100, it is desirable to provide the first metal portion 31 at a position more proximal to the upper electrode 21 and the upper electrode 22. For example, it is desirable to set the distance D1 to be shorter than the distance D2. By setting the first metal portion 31 to be more proximal to the upper electrode 21 and the upper electrode 22, the lengths of the paths illustrated by arrows A2 and A4 can be shorter even though the lengths of the paths illustrated by arrows A1 and A3 do not change. The electrical resistance between the upper electrode 21 and the upper electrode 22 can be reduced further while suppressing the damage to the semiconductor device 100.

It is desirable for the end portion of the first metal portion 31 to be exposed to the outside at the side surface of the semiconductor device 100. Because the first metal portion 31 includes a metal, the thermal conductivity is high compared to that of the n⁺-type semiconductor region 1. By exposing the end portion of the first metal portion 31, the heat that is generated in the interior of the semiconductor device 100 can be released to the outside more efficiently. The stability for the heat of the semiconductor device 100 can be improved; and the increase of the power consumption of the semiconductor device 100 due to the heat generation can be suppressed.

First Modification

FIG. 6A to FIG. 8B are perspective cross-sectional views illustrating semiconductor devices according to a first modification of the first embodiment.

Figure 6A:
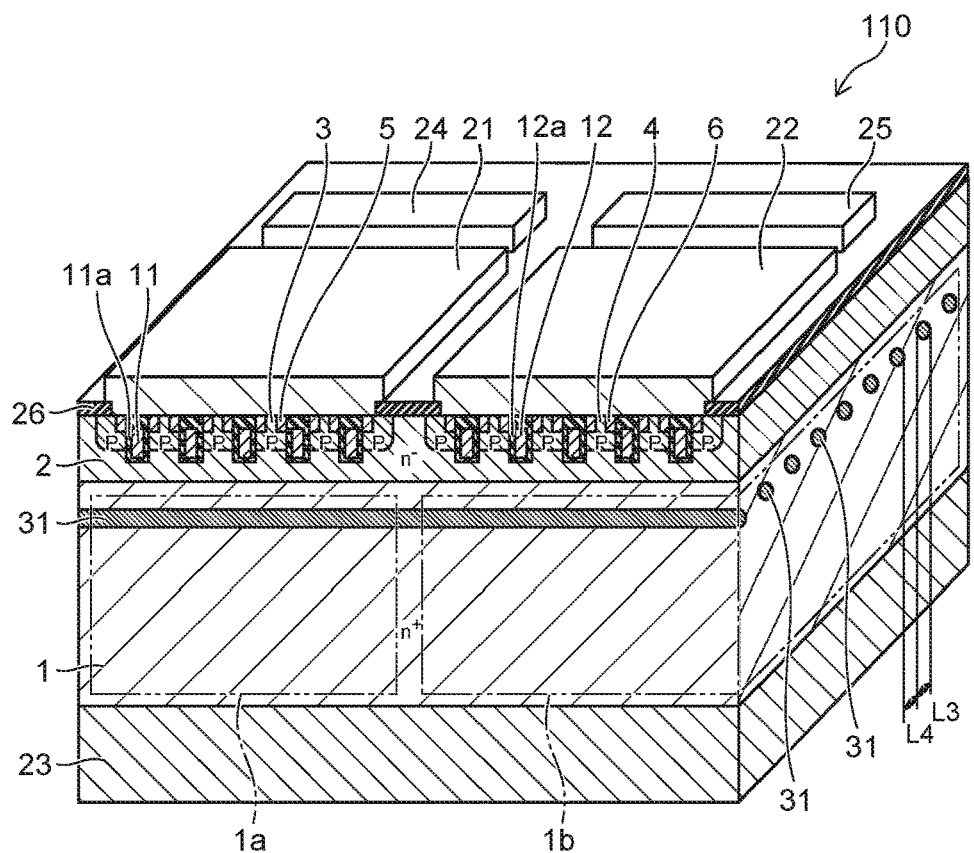
FIG. 6A to FIG. 8B are perspective cross-sectional views illustrating semiconductor devices according to a first modification of the first embodiment.

In a semiconductor device 110 illustrated in FIG. 6A, compared to the semiconductor device 100, more first metal portions 31 are provided in the Y-direction. For example, the length L3 in the Y-direction of the first metal portion 31 is substantially the same as the distance (the length L4) between the first metal portions 31.

Figure 6B:
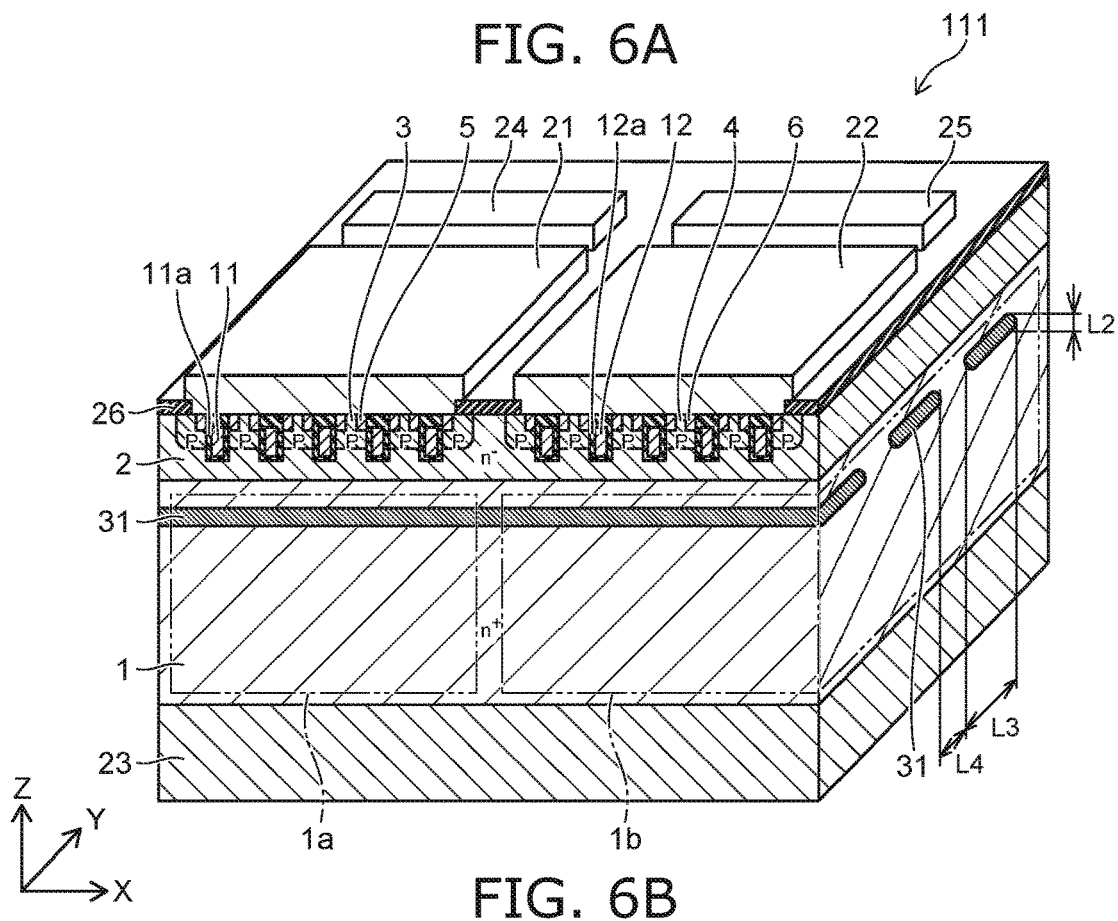

As in a semiconductor device 111 illustrated in FIG. 6B, the length L3 of the first metal portion 31 may be longer than the length L2. The length L3 of the first metal portion 31 may be longer than the distance (the length L4) between the first metal portions 31.

Figure 7A:
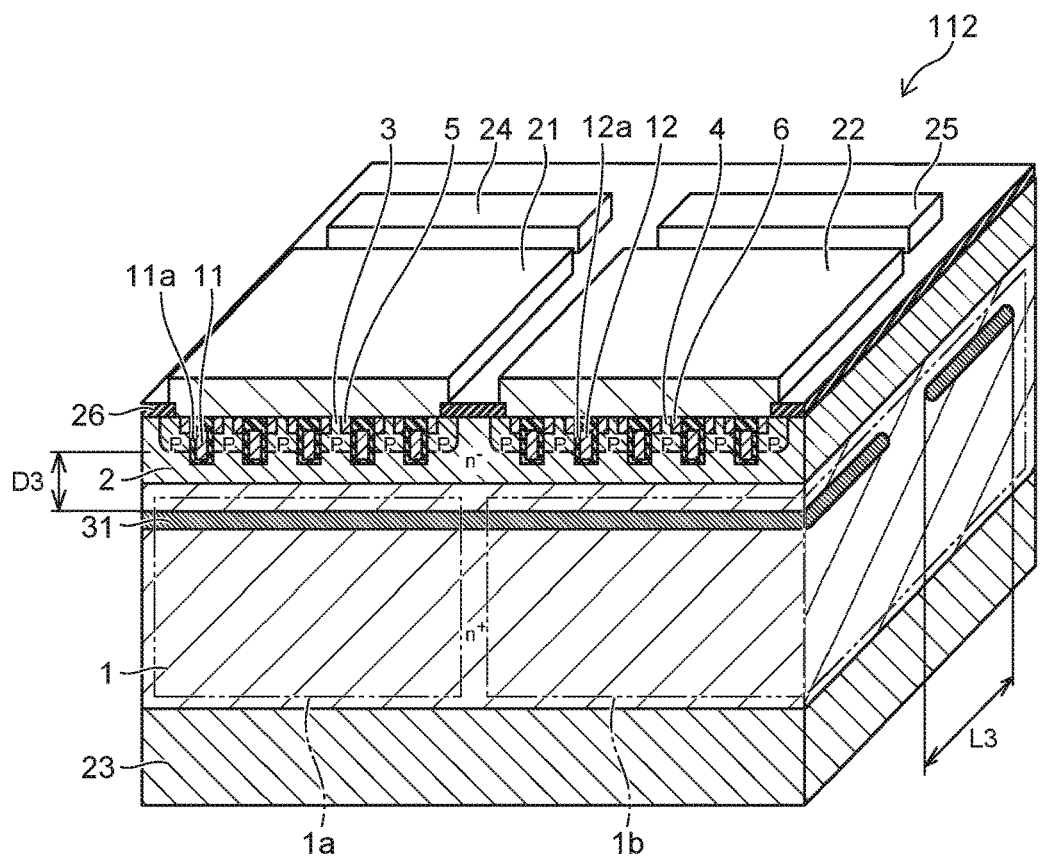

As in a semiconductor device 112 illustrated in FIG. 7A, the length L3 of the first metal portion 31 may be even longer. For example, in the semiconductor device 112, the length L3 is longer than a distance D3 between the first metal portion 31 and the p-type semiconductor region 3 (or the p-type semiconductor region 4). By setting the length L3 to be long, the electrical resistance of the first metal portion 31 can be reduced.

Figure 7B:
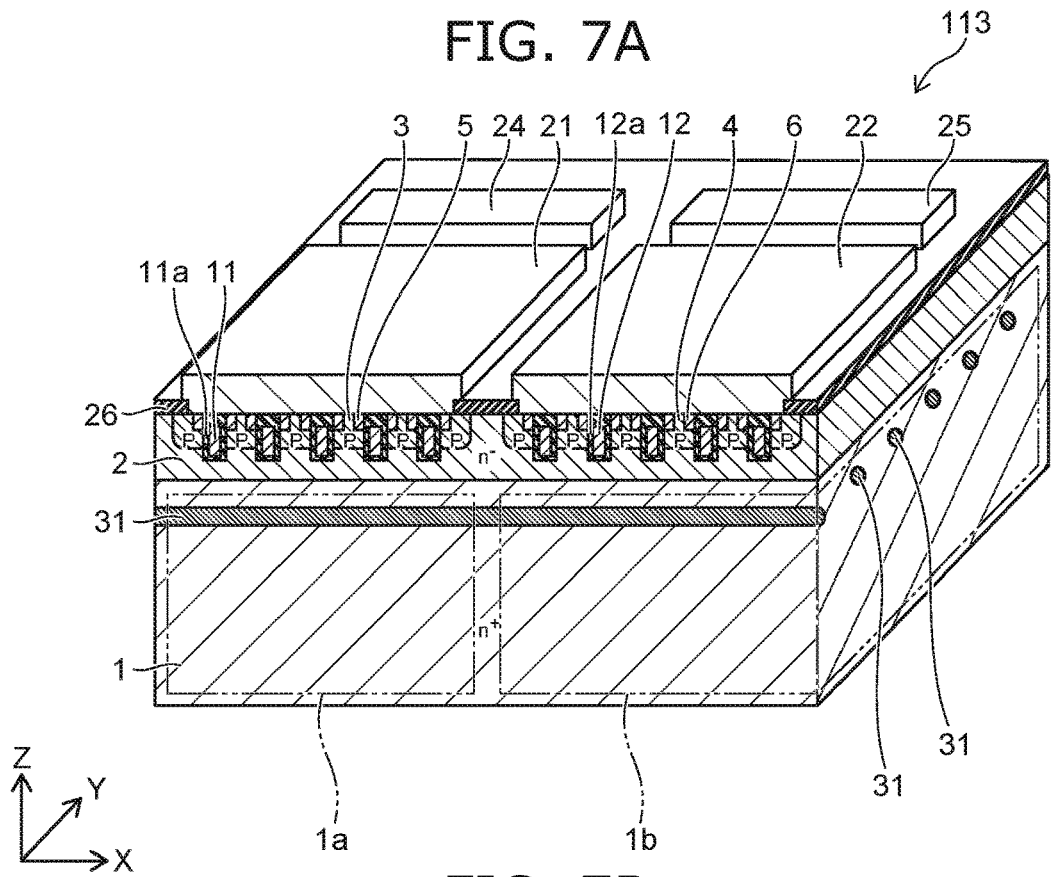

In a semiconductor device 113 illustrated in FIG. 7B, the lower electrode 23 is not provided. By providing the first metal portion 31, the current can flow sufficiently between the upper electrodes 21 and 22 even in the case where the lower electrode 23 is not provided. Because the formation of the lower electrode 23 is unnecessary, the number of processes necessary for manufacturing the semiconductor device can be reduced; and the manufacturing cost can be reduced.

Figure 8A:
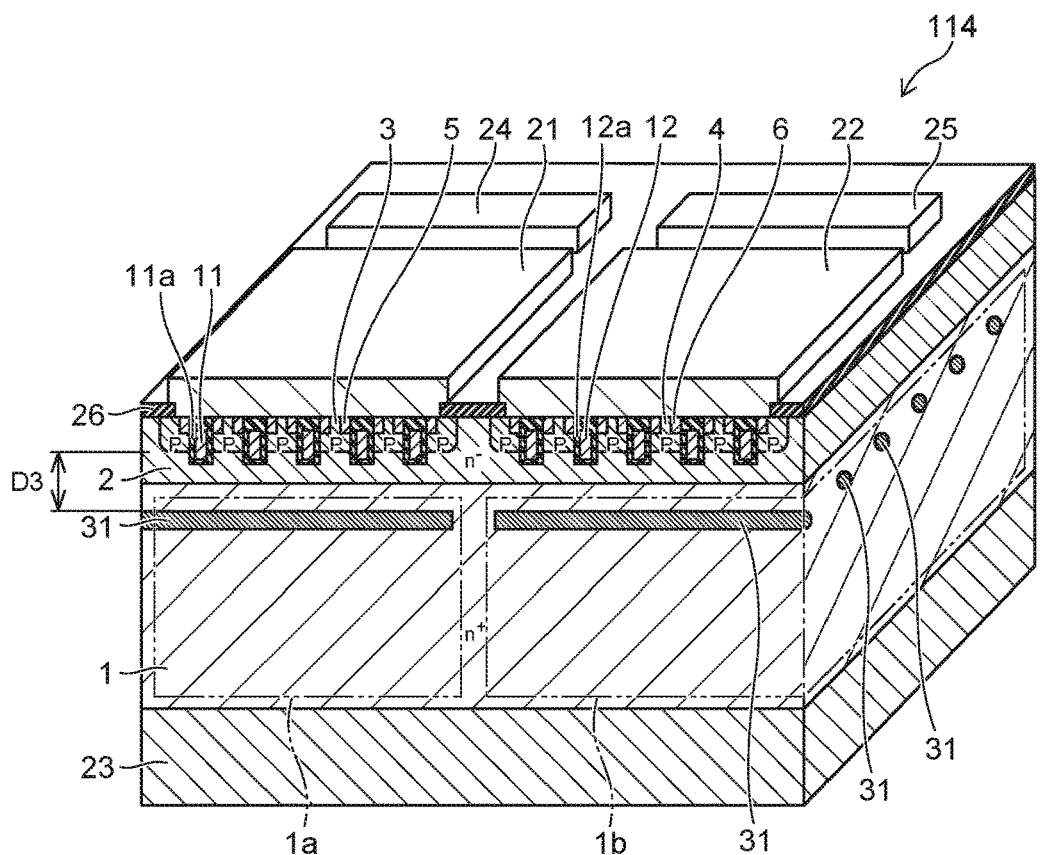

In a semiconductor device 114 illustrated in FIG. 8A, the first metal part 31 is multiply provided in the X-direction. One of the multiple first metal parts 31 is provided in the first portion 1a. Another one of the multiple first metal parts 31 is provided in the second portion 1b. The one of the multiple first metal parts 31 is arranged with, for example, the other one of the multiple first metal parts 31 in the X-direction. The portion of the n⁺-type semiconductor region 1 is provided between the one of the multiple first metal parts 31 and the other one of the multiple first metal parts 31.

Figure 8B:
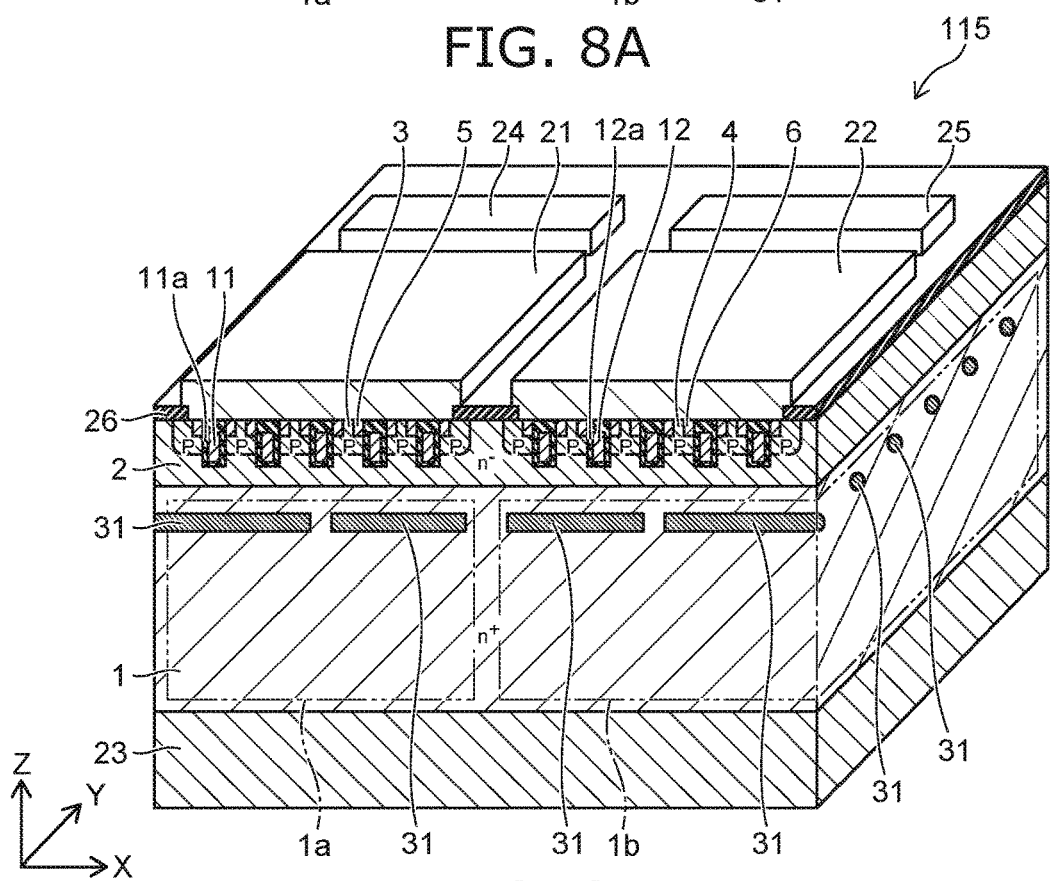

In a semiconductor device 114 illustrated in FIG. 8B, other multiple first metal parts 31 arranged in the X-direction are provided in the second portion 1b. The portion of the n⁺-type semiconductor region 1 is provided between the first metal parts 31 adjacent in the X-direction.

In the semiconductor devices 114 and 115, a length in the X-direction of the first metal part 31 is longer than a length in the Z-direction of the first metal part 31. For example, the length in the X-direction of the first metal part 31 is longer than the length between the first metal parts 31 adjacent in the X-direction.

The structures illustrated in FIG. 8A and FIG. 8B reduce the electrical resistance of the semiconductor device similar to other aspects. One first metal part 31 is desirably provided in the first portion 1a and the second portion 1b as illustrated in FIG. 1 and FIG. 6A to FIG. 7B. The structures illustrated in FIG. 1 and FIG. 6A to FIG. 7B furthermore reduce the electrical resistance of the semiconductor device compared with the structures illustrated in FIG. 8A and FIG. 8B.

Second Modification

Figure 9A:
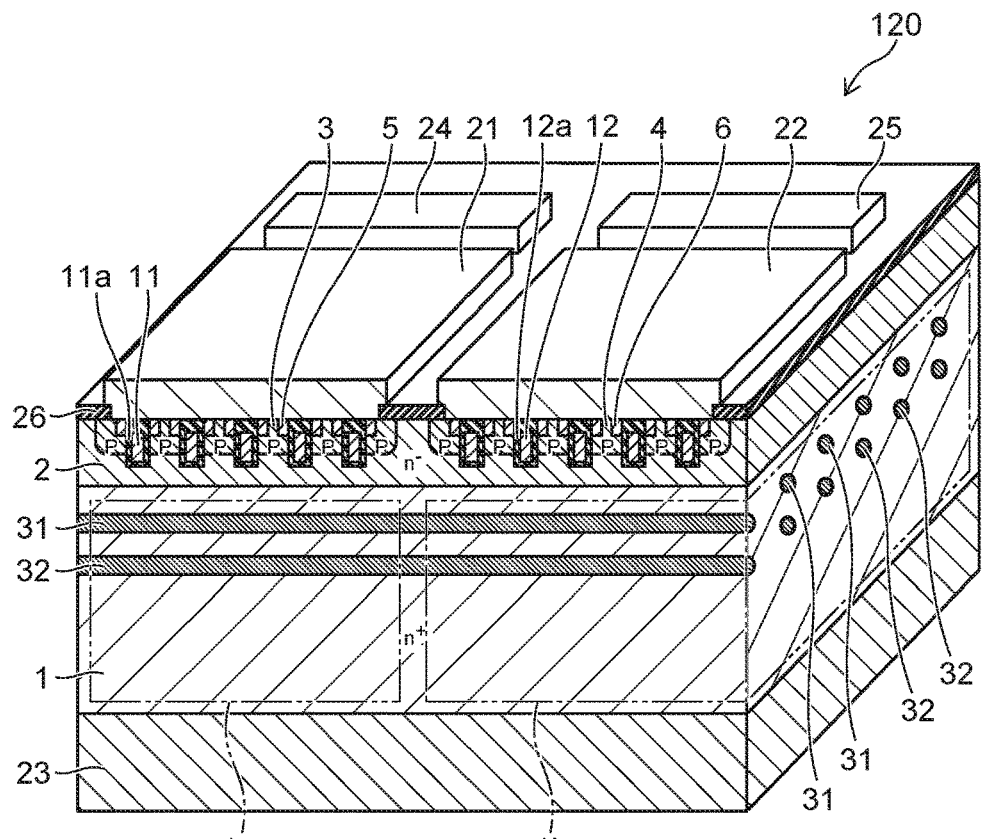
FIGS. 9A and 9B are perspective cross-sectional views illustrating semiconductor devices according to a second modification of the first embodiment.
Figure 9B:
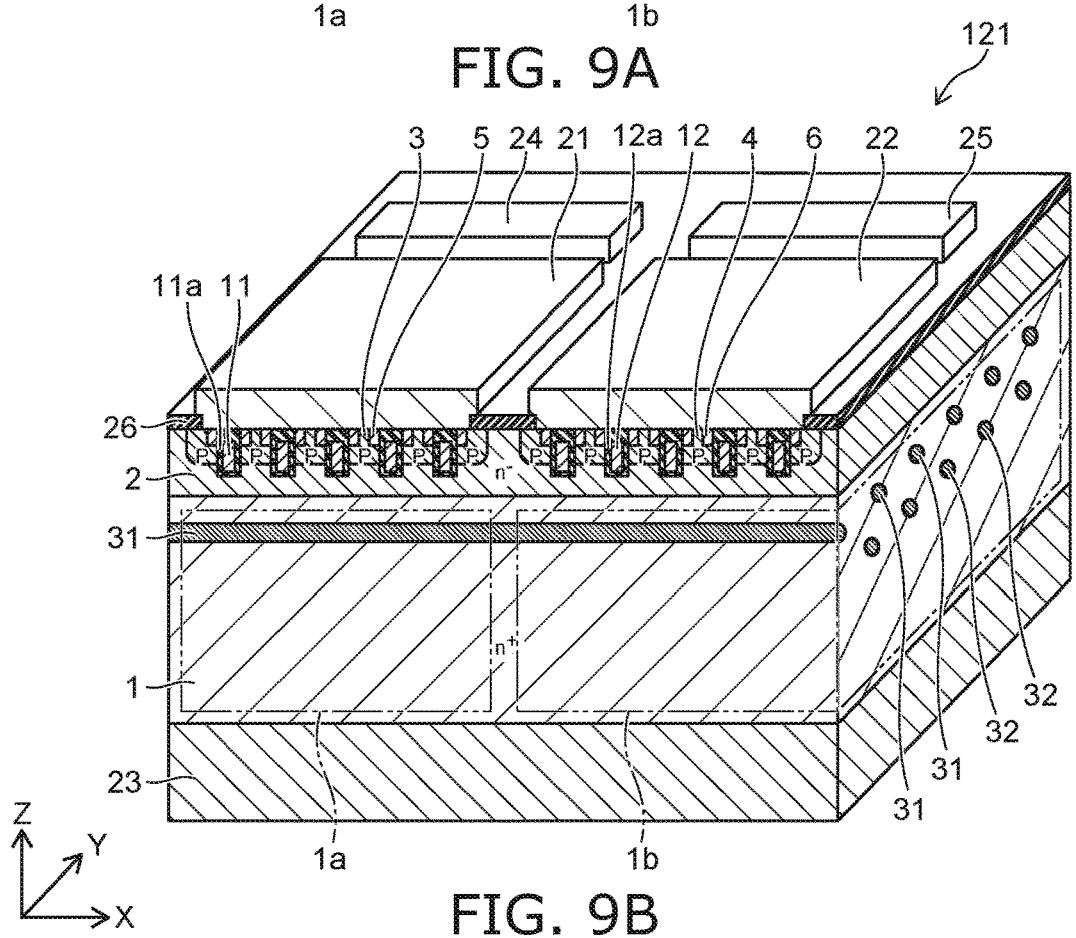

FIGS. 9A and 9B are perspective cross-sectional views illustrating semiconductor devices according to a second modification of the first embodiment.

A semiconductor device 120 illustrated in FIG. 9A further includes a second metal portion 32.

The second metal portion 32 is provided inside the first portion 1a and inside the second portion 1b. The second metal portion 32 is positioned lower than the first metal portion 31. For example, the position in the Y-direction of the second metal portion 32 is the same as the position in the Y-direction of the first metal portion 31.

In the manufacturing processes of the semiconductor device 120, first, processes similar to FIG. 3A and FIG. 3B are performed; and a hollow for forming the second metal portion 32 is formed at a position deeper than the hollow ES. Continuing, the processes of FIG. 3A and FIG. 3B are performed again; and the hollow ES for forming the first metal portion 31 is formed higher than the hollow. Subsequently, the trench T1 is formed to expose these hollows; and a metal layer is formed in the interiors of the hollows. Thereby, the first metal portion 31 and the second metal portion 32 are formed.

Or, as in a semiconductor device 121 illustrated in FIG. 9B, the position in the Y-direction of the second metal portion 32 may be different from the position in the Y-direction of the first metal portion 31. Even in such a case, the first metal portion 31 and the second metal portion 32 may be formed by repeating the processes illustrated in FIG. 3A and FIG. 3B as described above. Or, heat treatment is performed after forming, in the semiconductor substrate S, an opening reaching the position where the first metal portion 31 is provided and an opening reaching the position where the second metal portion 32 is provided. Thereby, the hollow for forming the first metal portion 31 and the hollow for forming the second metal portion 32 are formed simultaneously.

A desirable configuration of the second metal portion 32 is similar to the first metal portion 31. In other words, the second metal portion 32 is multiply provided in the Y-direction. The length in the X-direction of the second metal portion 32 is longer than the sum of the length L5 of the upper electrode 21 and the length L6 of the upper electrode 22. Similarly to the first metal portions 31 illustrated in FIGS. 6A to FIG. 7B, various modifications are applicable to the specific configuration of the second metal portion 32. Another metal portion may be further provided inside the first portion 1a and inside the second portion 1b below the second metal portion 32.

Third Modification

Figure 10:
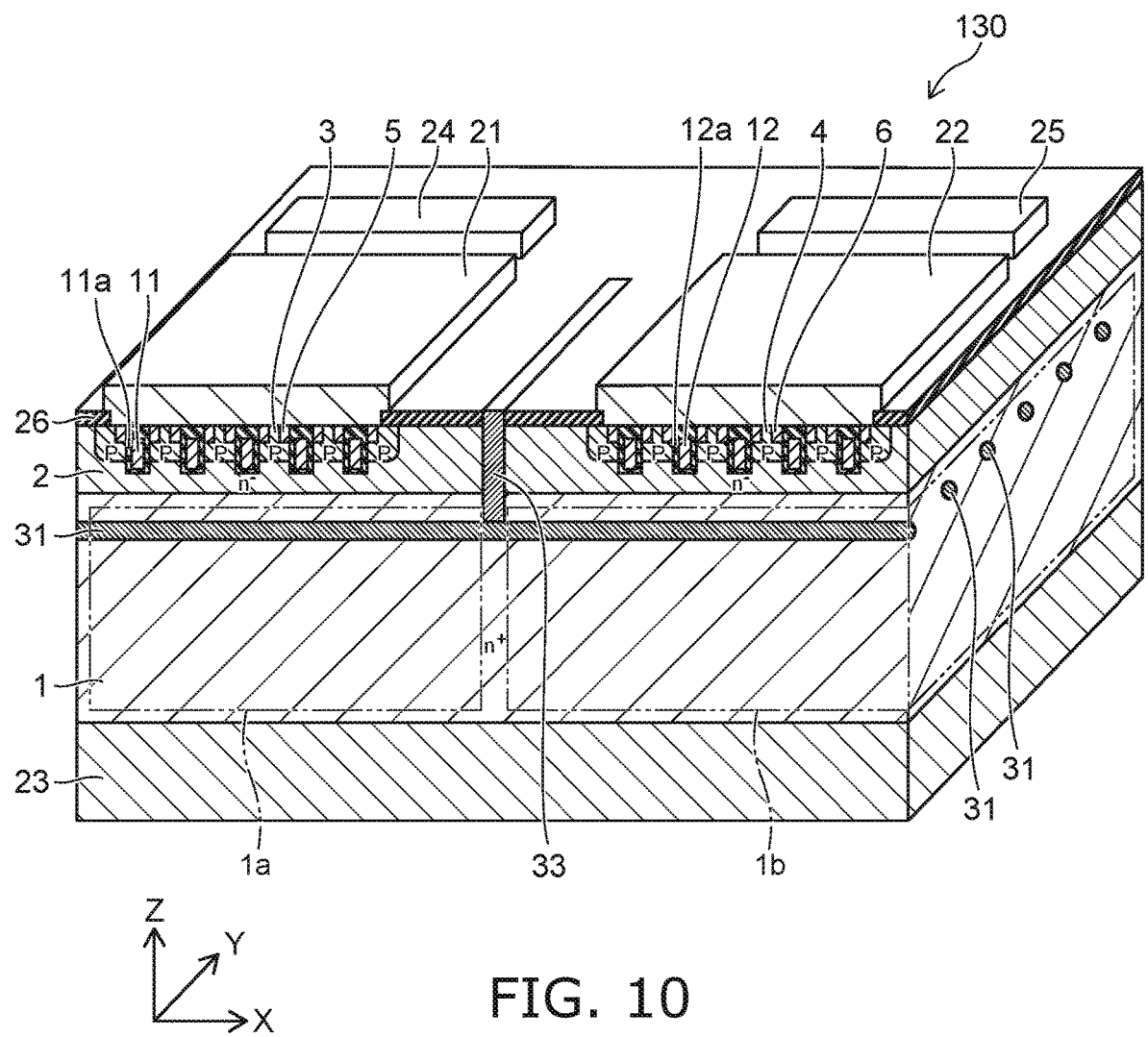
FIG. 10 is a perspective cross-sectional view illustrating a semiconductor device according to a third modification of the first embodiment.

FIG. 10 is a perspective cross-sectional view illustrating a semiconductor device according to a third modification of the first embodiment.

The semiconductor device 130 according to the third modification further includes a third metal portion 33.

The third metal portion 33 is connected to the first metal portion 31. The third metal portion 33 is provided inside the $n^+$-type semiconductor region 1 and inside the $n^-$-type semiconductor region 2. A portion of the third metal portion 33 is provided between the p-type semiconductor region 3 and the p-type semiconductor region 4 in the X-direction. For example, the third metal portion 33 extends to be continuous in the Y-direction. Or, the third metal portion 33 may be multiply provided in the Y-direction.

Figure 11A:
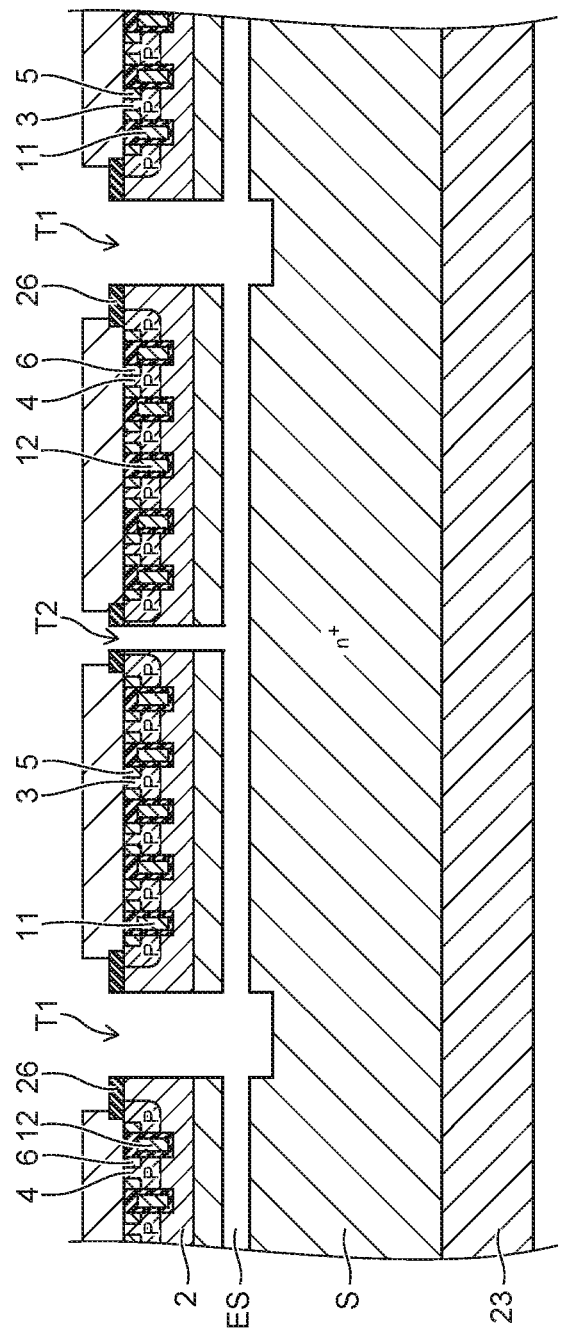
FIGS. 11A and 11B are cross-sectional views illustrating manufacturing processes of the semiconductor device according to the third modification of the first embodiment.
Figure 11B:
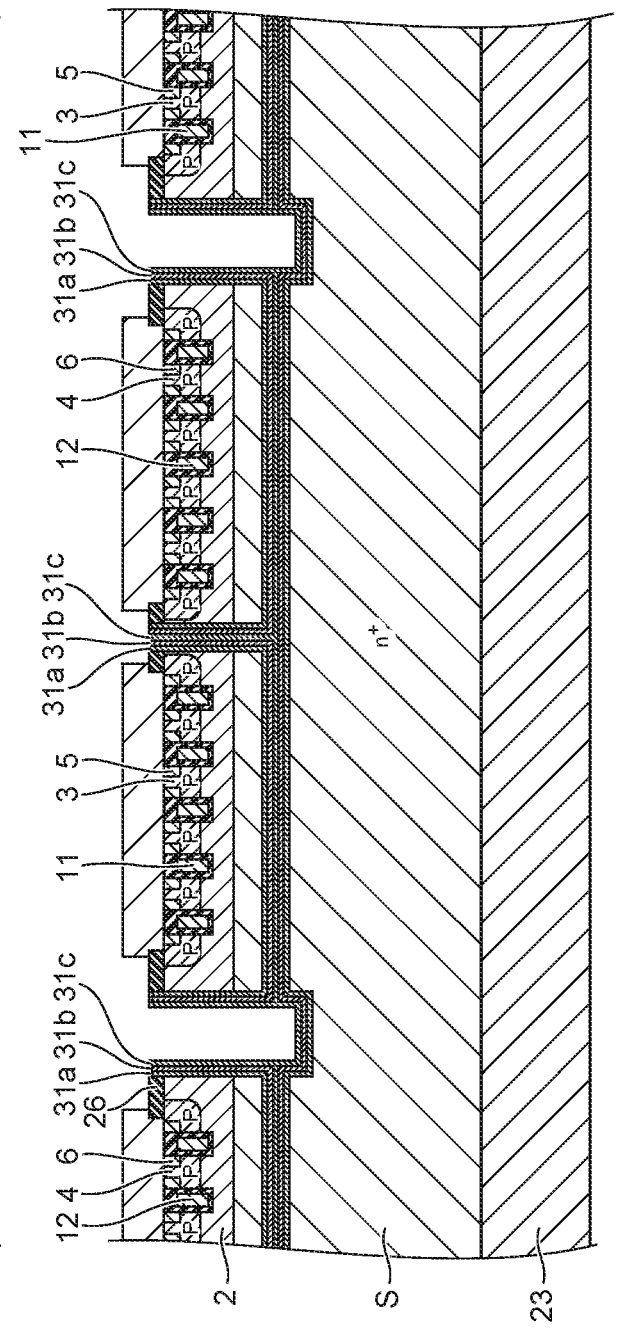

FIGS. 11A and 11B are cross-sectional views illustrating manufacturing processes of the semiconductor device according to the third modification of the first embodiment.

First, processes similar to the processes illustrated in FIG. 3A, FIG. 3B, and FIG. 4A are performed. Then, the trench T1 is formed around the p-type semiconductor region 3 and the p-type semiconductor region 4. As illustrated in FIG. 11A, a trench T2 is formed between the p-type semiconductor region 3 and the p-type semiconductor region 4. The trench T2 pierces the $n^-$-type semiconductor region 2 and communicates with the hollow ES.

As illustrated in FIG. 11B, the titanium layer 31a, the titanium nitride layer 31b, and the nickel layer 31c are sequentially formed inside the hollow ES through the trenches T1 and T2. The first metal portion 31 includes a portion of the titanium layer 31a, a portion of the titanium nitride layer 31b, and a portion of the nickel layer 31c provided inside the hollow ES. The third metal portion 33 includes another portion of the titanium layer 31a, another portion of the titanium nitride layer 31b, and another portion of the nickel layer 31c provided inside the trench T2. Subsequently, the semiconductor substrate S is diced similarly to the process illustrated in FIG. 5B. By the processes recited above, the semiconductor device 130 is manufactured.

Because the third metal portion 33 includes a metal, the thermal conductivity is high compared to that of the $n^-$-type semiconductor region 2. By providing the third metal portion 33, the heat that is generated in the interior of the semiconductor device 130 can be released from the upper surface of the semiconductor device 130 more efficiently. Thereby, the stability for the heat of the semiconductor device 130 can be improved; and the increase of the power consumption of the semiconductor device 130 due to the heat generation can be suppressed.

In the case where the third metal portion 33 is provided, it is desirable for the distance between the third metal portion 33 and the p-type semiconductor region 3 and the distance between the third metal portion 33 and the p-type semiconductor region 4 to be sufficiently long. In the case where these distances are short, the electric field intensity becomes high between the third metal portion 33 and the p-type semiconductor region 3 and between the third metal portion 33 and the p-type semiconductor region 4; and there is a possibility that the breakdown voltage of the semiconductor device 130 may decrease or the leakage current of the semiconductor device 130 may increase. To suppress the decrease of the breakdown voltage and the increase of the leakage current of the semiconductor device 130, it is desirable for the distance in the X-direction between the third metal portion 33 and the p-type semiconductor region 3 to be not less than the distance in the Z-direction between the first metal portion 31 and the p-type semiconductor region 3. Similarly, it is desirable for the distance in the X-direction between the third metal portion 33 and the p-type semiconductor region 4 to be not less than the distance in the Z-direction between the first metal portion 31 and the p-type semiconductor region 4.

In the method for manufacturing the semiconductor device according to the modification, the trench T2 that communicates with the hollow ES is formed as illustrated in FIG. 11A. For example, in the case where the metal layer is formed inside the hollow ES using CVD, the gas is supplied to the hollow ES through the trench T2 in addition to the trench T1. In the case where the metal layer is formed inside the hollow ES by plating, the plating liquid flows into the hollow ES from the trenches T1 and T2. Thereby, as illustrated in FIG. 5B, the void V is not formed easily inside the first metal portion 31. Compared to the case where the void V exists inside the first metal portion 31, the electrical resistance of the first metal portion 31 can be reduced when there are no voids V. Accordingly, according to the manufacturing method according to the modification, the electrical resistance of the first metal portion 31 can be reduced; and as a result, the electrical resistance between the upper electrode 21 and the upper electrode 22 can be reduced further.

Fourth Modification

Figure 12:
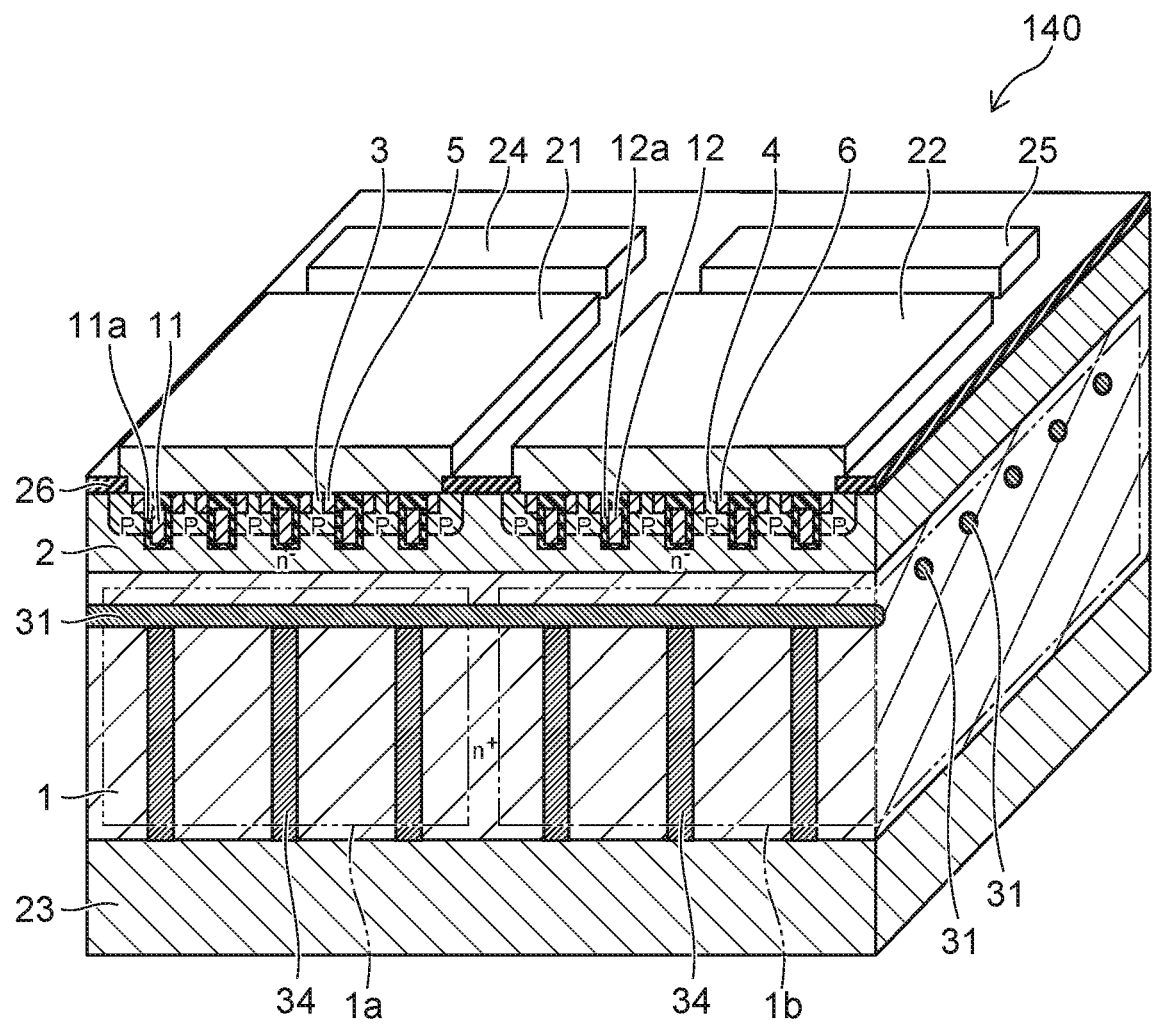
FIG. 12 is a perspective cross-sectional view illustrating a semiconductor device according to a fourth modification of the first embodiment.

FIG. 12 is a perspective cross-sectional view illustrating a semiconductor device according to a fourth modification of the first embodiment.

The semiconductor device 140 illustrated in FIG. 12 further includes a fourth metal portion 34. The fourth metal portion 34 is provided inside the n$^+$-type semiconductor region 1 and positioned between the first metal portion 31 and the lower electrode 23. The fourth metal portion 34 is connected to the lower electrode 23 and the first metal portion 31.

By providing the fourth metal portion 34, the electrical resistance between the first metal portion 31 and the lower electrode 23 can be reduced. Thereby, the electrical resistance between the upper electrode 21 and the upper electrode 22 can be reduced further.

It is desirable for the fourth metal portion 34 to be multiply provided in the X-direction and the Y-direction. The multiple fourth metal portions 34 are separated from each other. By providing the multiple fourth metal portions 34, the electrical resistance between the upper electrode 21 and the upper electrode 22 can be reduced further.

Application Example

Figure 13:
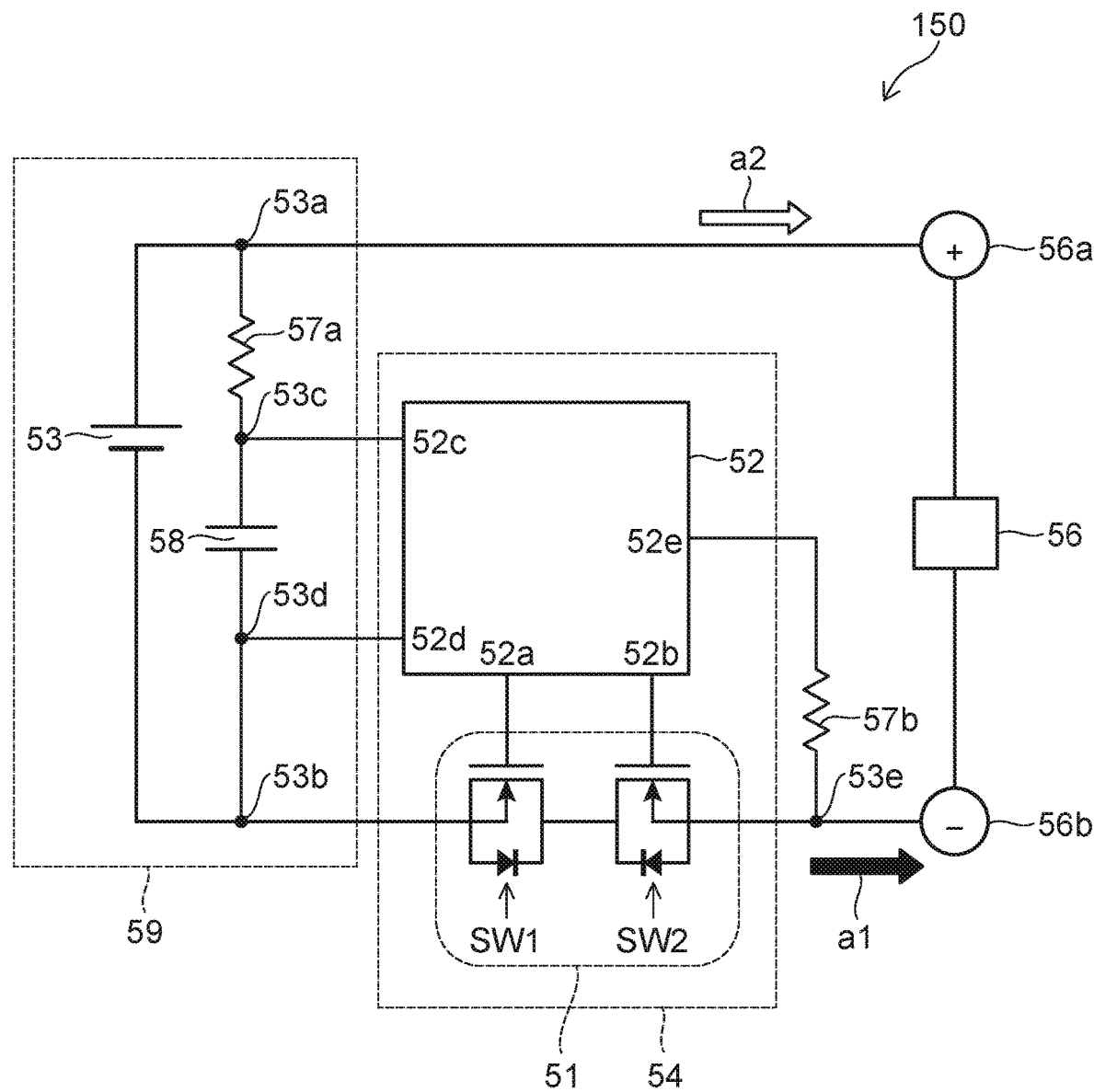
FIG. 13 is a circuit diagram illustrating an electrical device including the semiconductor device according to the first embodiment.

FIG. 13 is a circuit diagram illustrating an electrical device including the semiconductor device according to the first embodiment.

The electrical device 150 illustrated in FIG. 13 includes a protection circuit 54, a power supply 56, and a circuit 59. The power supply 56 includes a positive terminal 56a and a negative terminal 56b. The protection circuit 54 and the circuit 59 are connected between the positive terminal 56a and the negative terminal 56b.

The protection circuit 54 includes a semiconductor device 51 and a control circuit 52. The semiconductor device 51 is one of the semiconductor devices according to the first embodiment. As described above, the semiconductor device 51 includes the switching element SW1 and the switching element SW2. The switching element SW1 includes a body diode including the n$^-$-type semiconductor region 2 and the p-type semiconductor region 3. The switching element SW2 includes a body diode including the n$^-$-type semiconductor region 2 and the p-type semiconductor region 4. These body diodes are respectively connected in parallel with the switching elements SW1 and SW2.

The gate electrode 11 of the switching element SW1 and the gate electrode 12 of the switching element SW2 are connected respectively to terminals 52a and 52b of the control circuit 52. The control circuit 52 controls the voltages of the gate electrode 11 and the gate electrode 12.

The circuit 59 includes a secondary cell 53, a load 57a, and a capacitor 58. A terminal 53a on the positive side of the circuit 59 is connected to the positive terminal 56a. A terminal 53b on the negative side of the circuit 59 is connected to the negative terminal 56b via the semiconductor device 51. The load 57a and the capacitor 58 are connected in series between the terminal 53a and the terminal 53b. The secondary cell 53 is connected between the terminal 53a and the terminal 53b in parallel with the load 57a and the capacitor 58. A terminal 53c between the load 57a and the capacitor 58 is connected to a terminal 52c of the control circuit 52. A terminal 53d between the terminal 53b and the capacitor 58 is connected to a terminal 52d of the control circuit 52.

The terminal 53b is connected to the upper electrode 21 of the semiconductor device 51. A terminal 53e that is connected to the upper electrode 22 is connected to the negative terminal 56b. The terminal 53e is connected to a terminal 52e of the control circuit 52. A load 57b is connected between the terminal 52e and the terminal 53e.

The electrical device 150 performs the charging and the discharging of the secondary cell 53.

The control circuit 52 detects the voltage of the secondary cell 53 via the terminal 52c. The control circuit 52 switches the switching element SW1 and the switching element SW2 ON in the case where the voltage is within a prescribed range. A current flows in the direction of arrow a1 when the switching element SW1 and the switching element SW2 are switched ON when performing the charging operation of the secondary cell 53. A current flows in the direction of arrow a2 when the switching element SW1 and the switching element SW2 are switched ON when performing the discharging operation of the secondary cell 53.

The electrical device 150 further performs a protection operation of preventing overcharging and over-discharging.

First, the protection operation for overcharge will be described. The control circuit 52 detects the voltage of the secondary cell 53 via the terminal 52c. The secondary cell 53 is in an overcharged state in the case where the voltage of the secondary cell 53 is larger than the upper limit of the prescribed range. In such a case, the control circuit 52 sets the voltage of the terminal 52b to be less than the threshold and sets the switching element SW2 to the OFF-state. The control circuit 52 sets the voltage of the terminal 52a to be the threshold or more and sets the switching element SW1 to the ON-state. Thereby, the state becomes a state in which the switching element SW1 is connected in series to the body diode in parallel with the switching element SW2. The forward direction of the body diode is the direction of arrow a2. In the case where the secondary cell 53 is overcharged, the current passes through the body diode and the switching element SW1, flows in the direction of arrow a2, and discharges the secondary cell 53. The reverse direction of the body diode in parallel with the switching element SW2 is the direction of arrow a1. Therefore, the flow of the current in the direction of arrow a1 is suppressed; and further charging of the secondary cell 53 is prevented.

The protection operation for over-discharge will now be described. The control circuit 52 detects the voltage of the secondary cell 53 via the terminal 52c. In the case where the voltage of the secondary cell 53 is smaller than the lower limit of the prescribed range, the secondary cell 53 is in an over-discharged state. In such a case, the control circuit 52 sets the voltage of the terminal 52a to be less than the threshold and sets the switching element SW1 to the OFF-state. The control circuit 52 sets the voltage of the terminal 52b to be the threshold or more and sets the switching element SW2 to the ON-state. Thereby, the state becomes a state in which the MOSFET of the switching element SW2 is connected in series to the body diode in parallel with the switching element SW1. The forward direction of the body diode is the direction of arrow a1. In the case where the secondary cell 53 is over-discharged, the current passes through the body diode and the switching element SW2, flows in the direction of arrow a1, and charges the secondary cell 53. The reverse direction of the body diode in parallel with the switching element SW1 is the direction of arrow a2. Therefore, the flow of the current in the direction of arrow a2 is suppressed; and further discharging of the secondary cell 53 is prevented.

The electrical device 150 further performs a protection operation for overcurrent.

The control circuit 52 detects the current flowing through the terminal 53e via the terminal 52e. For example, when charging the secondary cell 53, the current flows in the direction of arrow a1. When charging the secondary cell 53, if a current value greater than a prescribed value is detected, the control circuit 52 sets the switching element SW2 to the OFF-state. The forward direction of the body diode in parallel with the switching element SW2 is the direction of arrow a2. Therefore, the flow of the current in the direction of arrow a1 can be suppressed.

When discharging the secondary cell 53, the current flows in the direction of arrow a2. When discharging the secondary cell 53, if a current value greater than the prescribed value is detected, the control circuit 52 sets the switching element SW1 to the OFF-state. The forward direction of the body diode in parallel with the switching element SW1 is the direction of arrow a1. Therefore, the flow of the current in the direction of arrow a2 can be suppressed.

By using the semiconductor device according to the first embodiment as the semiconductor device 51 of the electrical device 150, the electrical power that is necessary when charging or discharging the secondary cell 53 can be reduced. As a result, the power consumption of the electrical device 150 can be reduced.

Second Embodiment

Figure 14:
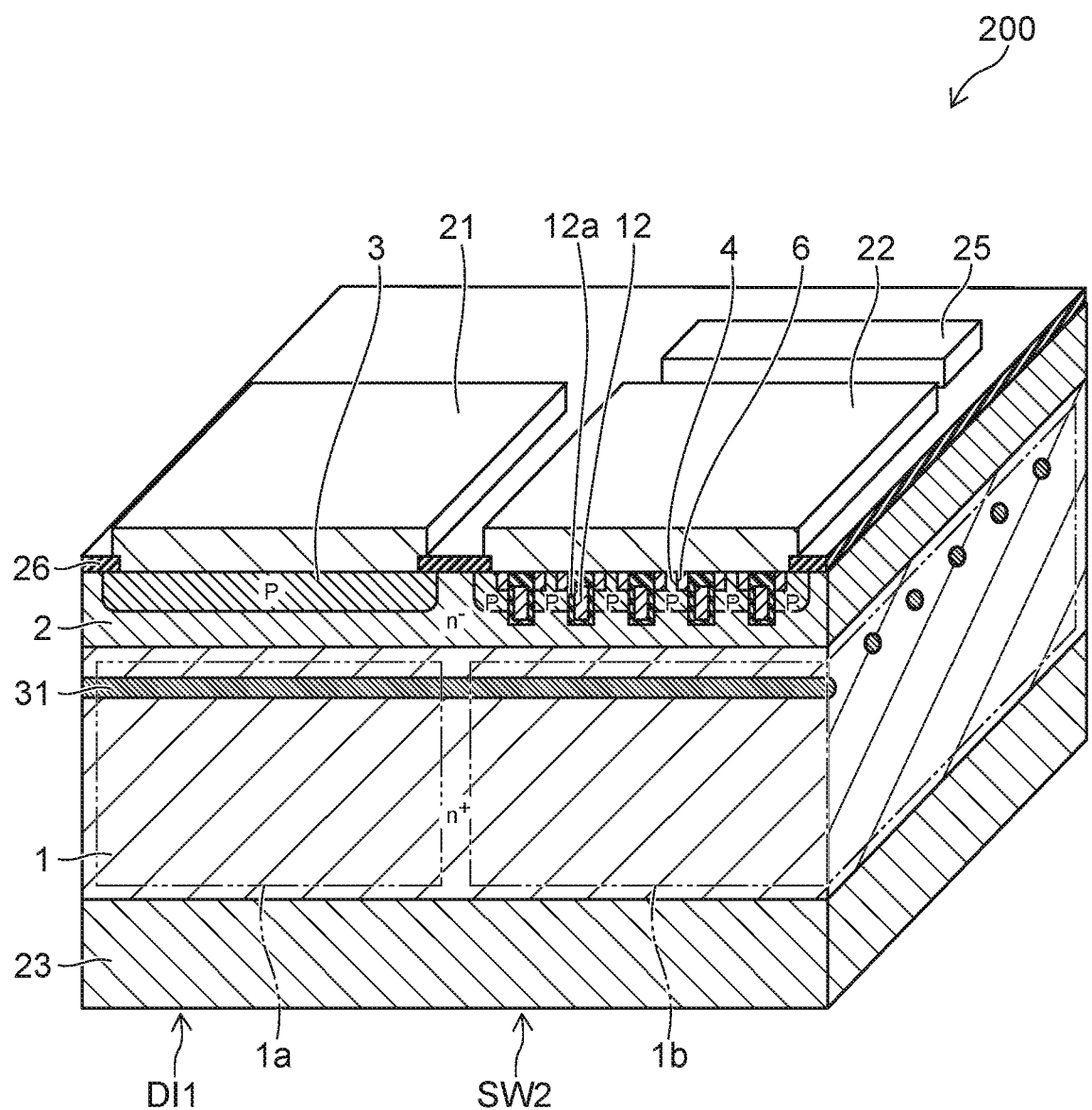
FIG. 14 is a perspective cross-sectional view illustrating a semiconductor device according to a second embodiment.

FIG. 14 is a perspective cross-sectional view illustrating a semiconductor device according to a second embodiment.

The semiconductor device 200 illustrated in FIG. 14 does not include the n+-type semiconductor region 5, the gate electrode 11, and the gate pad 24. In other words, the semiconductor device 200 includes a diode DI1 instead of the switching element SW1.

When the switching element SW2 is set to the ON-state, a current flows from the anode (the p-type semiconductor region 3) to the cathode (the n−-type semiconductor region 2) of the diode DI1, passes through the first metal portion 31 and the lower electrode 23, and flows toward the upper electrode 22.

When the switching element SW2 is set to the OFF-state, the device has a bidirectional breakdown voltage. In other words, in the semiconductor device 200, the conduction can be blocked in the case where a positive voltage with respect to the upper electrode 22 of the switching element SW2 is applied to the upper electrode 21 of the diode DI1 and in the reverse case.

According to the second embodiment, similarly to the first embodiment, the electrical resistance between the upper electrode 21 and the upper electrode 22 can be reduced by providing the first metal portion 31.

Modification

Figure 15:
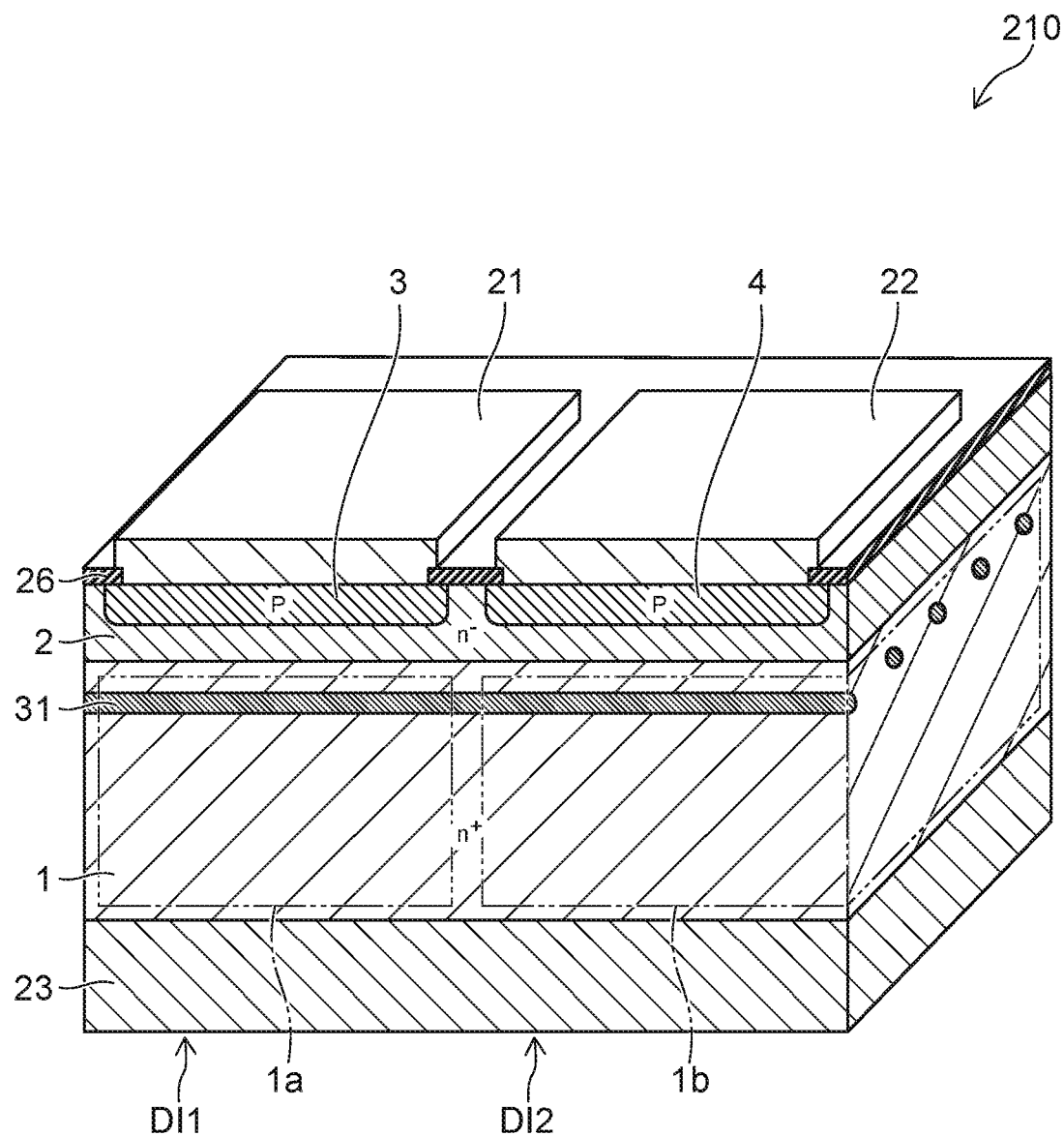
FIG. 15 is a perspective cross-sectional view illustrating a semiconductor device according to a modification of the second embodiment.

FIG. 15 is a perspective cross-sectional view illustrating a semiconductor device according to a modification of the second embodiment.

Compared to the semiconductor device 200, the semiconductor device 210 illustrated in FIG. 15 does not include the n+-type semiconductor region 6, the gate electrode 12, and the gate pad 25. In other words, the semiconductor device 210 includes a diode DI2 instead of the switching element SW2. The forward direction of the diode DI2 is the reverse of the forward direction of the diode DI1.

For example, a voltage that is positive with respect to the upper electrode 22 is applied to the upper electrode 21. When the voltage is larger than the breakdown voltage between the n−-type semiconductor region 2 and the p-type semiconductor region 4, a current passes through the first metal portion 31 and the lower electrode 23 and flows from the upper electrode 21 toward the upper electrode 22. This is similar also for the case where a voltage positive with respect to the upper electrode 21 is applied to the upper electrode 22. In other words, the semiconductor device 210 functions as a bidirectional-breakdown voltage diode.

Figure 16:
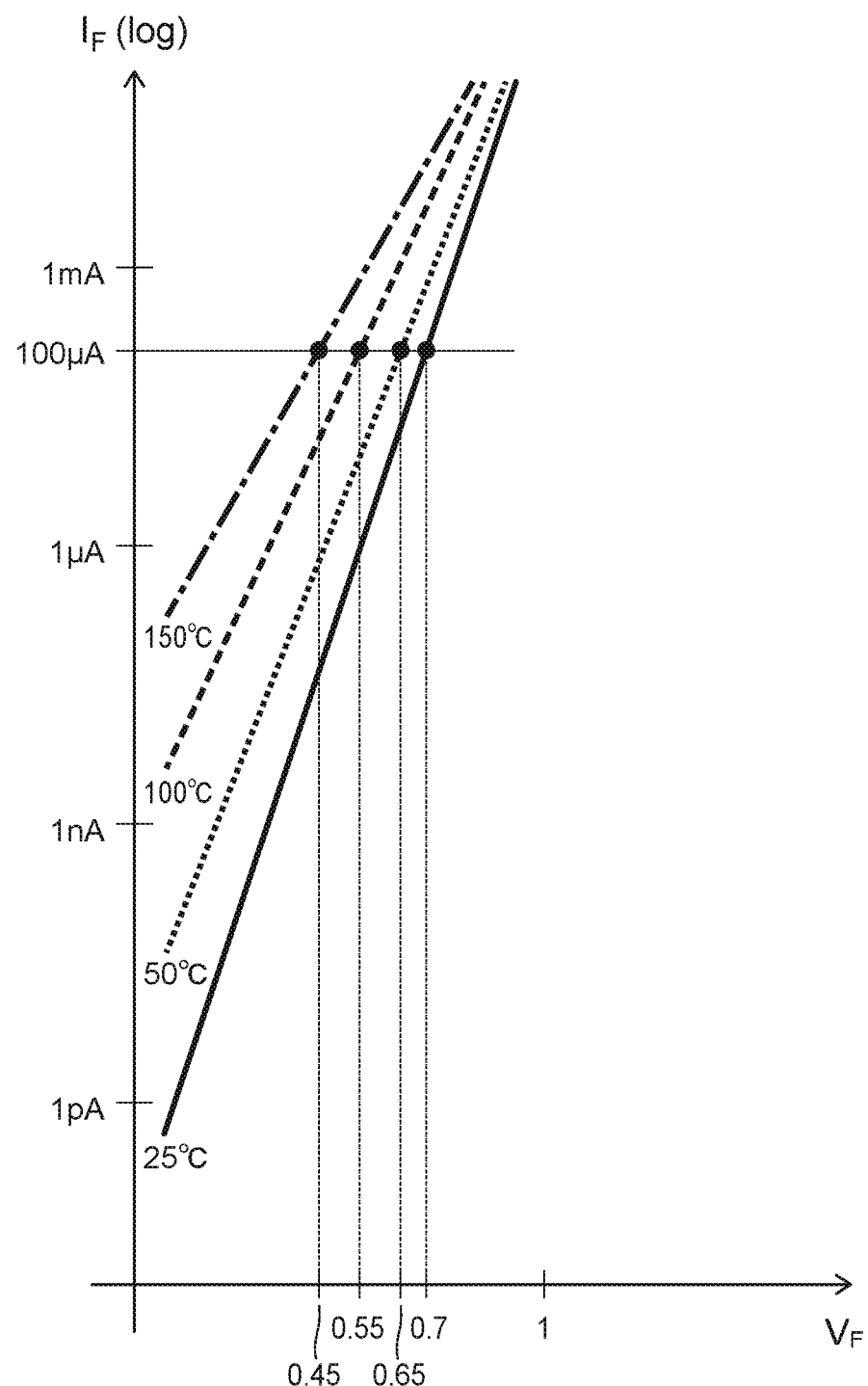
FIG. 16 is a graph showing characteristics of a diode under application of a forward voltage.

FIG. 16 is a graph showing characteristics of a diode under application of a forward voltage.

Figure 17:
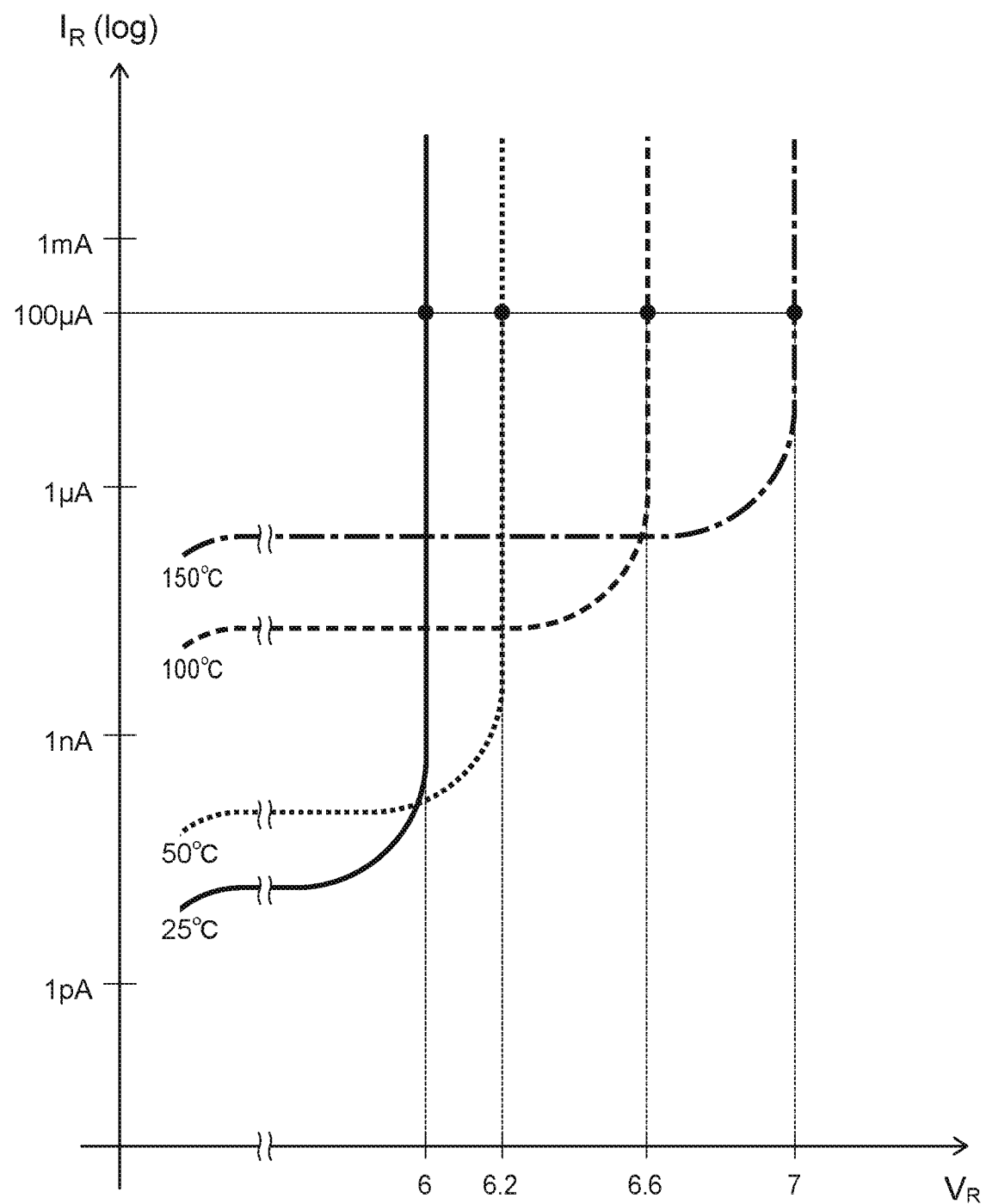
FIG. 17 is a graph showing characteristics of a diode under application of a reverse voltage.

FIG. 17 is a graph showing characteristics of a diode under application of a reverse voltage.

In FIG. 16, the horizontal axis represents a forward voltage $V_F$ applied to the diode. The vertical axis represents a forward current $I_F$ flowing through the diode. In FIG. 17, the horizontal axis represents a reverse voltage $V_R$ applied to the diode. The vertical axis represents a reverse current $I_R$ flowing through the diode.

In FIG. 16 and FIG. 17, the vertical axis is represented by the log scale. The horizontal axis is represented by the linear scale. The solid line shows the characteristic of the diode at 25° C. The dotted line shows the characteristic of the diode at 50° C. The broken line shows the characteristic of the diode at 100° C. The dash-dotted line shows the characteristic of the diode at 150° C.

As illustrated in FIG. 16, generally, a forward diode has a negative temperature characteristic of the voltage drop. That is, for the forward diode, as the temperature increases, the forward voltage drop decreases. For the forward diode, as the temperature increases, a rate of a current change to a voltage change changes. As illustrated in FIG. 17, a reverse diode has a positive temperature characteristic. For example, for the reverse diode with a large breakdown voltage, as the temperature increases, the breakdown voltage increases.

For example, as illustrated in FIG. 16, a voltage necessary for energizing a current of 100 μA in a forward direction at 25° C. is 0.7 V. A voltage necessary for energizing a current of 100 μA in a forward direction at 50° C. is 0.65 V. A voltage necessary for energizing a current of 100 μA in a forward direction at 100° C. is 0.55 V. A voltage necessary for energizing a current of 100 μA in a forward direction at 150° C. is 0.45 V. As the temperature increases by about 1° C., a voltage necessary for energizing a current of 100 μA decreases by about 2 mV.

As illustrated in FIG. 17, a voltage necessary for energizing a current of 100 μA in a reverse direction at 25° C. is 6 V. A voltage necessary for energizing a current of 100 μA in a reverse direction at 50° C. is 6.2 V. A voltage necessary for energizing a current of 100 μA in a reverse direction at 100° C. is 6.6 V. A voltage necessary for energizing a current of 100 μA in a reverse direction at 150° C. is 7.0 V. As the temperature increases by about 1° C., a voltage necessary for energizing a current of 100 μA increases by about 8 mV.

Figure 18:
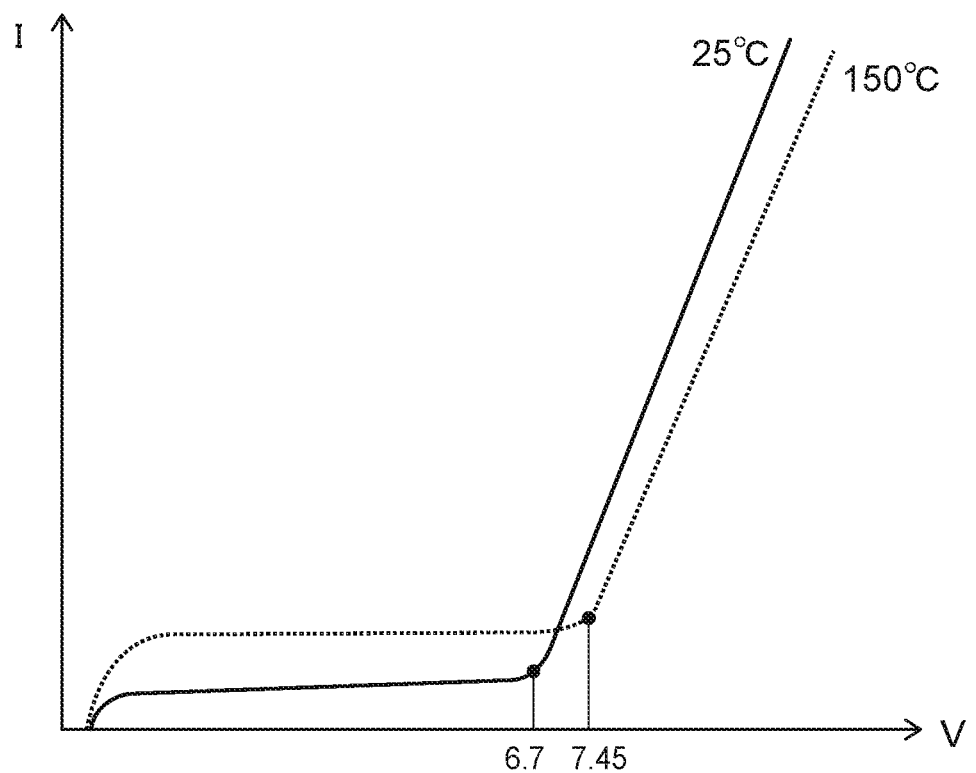
FIG. 18 is a graph showing characteristics of the semiconductor device according to the modification of the second embodiment.

FIG. 18 is a graph showing characteristics of the semiconductor device according to the modification of the second embodiment.

In FIG. 18, the horizontal axis represents a voltage V applied to the semiconductor device 210. The vertical axis represents a current I flowing through the semiconductor device 210. The vertical axis is represented by the log scale. The horizontal axis is represented by the linear scale. The solid line shows the characteristic of the semiconductor device 210 at 25° C. The dotted line shows the characteristic of the semiconductor device 210 at 150° C.

In the semiconductor device 210, the diodes DI1 and DI2 which have mutually reversed forward directions are connected in series. Thereby, as illustrated in FIG. 18, it is possible to compensate for the voltage change with respect to the temperature change of the diode DI1 and the voltage change with respect to the temperature change of the diode DI2. Therefore, it is possible to realize a bidirectional breakdown voltage element with small temperature change.

According to the modification, similarly to the semiconductor device 200, the electrical resistance between the upper electrode 21 and the upper electrode 22 can be reduced by providing the first metal portion 31.

It is also possible to apply the configurations according to the modifications of the first embodiment to the semiconductor device according to the second embodiment. For example, the semiconductor device according to the second embodiment may further include the second metal portion 32. The semiconductor device according to the second embodiment may not include the lower electrode 23.

It is possible to confirm the relative levels of the impurity concentrations of the semiconductor regions in the embodiments described above, for example, using a SCM (scanning capacitance microscope). The carrier concentrations of the semiconductor regions may be considered to be equal to the activated impurity concentrations of the semiconductor regions. Accordingly, the relative levels of the carrier concentrations of the semiconductor regions can be confirmed using SCM. It is possible to measure the impurity concentrations of the semiconductor regions, for example, using a SIMS (secondary ion mass spectrometer).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Moreover, above-mentioned embodiments can be combined mutually and can be carried out.

What is claimed is:

1. A semiconductor device, comprising:
a first semiconductor region including a first portion and a second portion, the first semiconductor region being of the first conductivity type, the second portion being arranged with the first portion in a first direction;
a second semiconductor region provided on the first portion and on the second portion, the second semiconductor region being of the first conductivity type, a second direction from the first semiconductor region toward the second semiconductor region being perpendicular to the first direction, an impurity concentration of the first conductivity type in the second semiconductor region being lower than an impurity concentration of the first conductivity type in the first semiconductor region;
a third semiconductor region provided on a portion of the second semiconductor region, the third semiconductor region being of a second conductivity type and being positioned on the first portion;
a first electrode provided on the third semiconductor region;
a fourth semiconductor region provided on another portion of the second semiconductor region, the fourth semiconductor region being of the second conductivity type, being separated from the third semiconductor region, and being positioned on the second portion;
a fifth semiconductor region provided on a portion of the third semiconductor region, the fifth semiconductor region being of the first conductivity type;
a first gate electrode opposing the second semiconductor region, the third semiconductor region, and the fifth semiconductor region with a first gate insulating layer interposed in the first direction;
a sixth semiconductor region provided on a portion of the fourth semiconductor region, the sixth semiconductor region being of the first conductivity type;
a second gate electrode opposing the second semiconductor region, the fourth semiconductor region, and the sixth semiconductor region with a second gate insulating layer interposed in the first direction;
a first metal portion extending along the first direction, a portion of the first semiconductor region being provided between the second semiconductor region and the first metal portion, between the first gate electrode and the first metal portion, and between the second gate electrode and the first metal portion, the first metal portion being provided between another portion of the first semiconductor region and the portion of the first semiconductor region in the second direction, the first metal portion directly contacting with the portion of the first semiconductor region and the other portion of the first semiconductor region, a length of the first metal portion in a third direction is longer than a length of the first metal portion in the second direction, the third direction being perpendicular to the first direction and the second direction, a plurality of the first metal portions being provided along a third direction perpendicular to the first direction and the second direction, the plurality of first metal portions being separated from each other;
a second electrode provided on the fourth semiconductor region; and
a third electrode, the other portion of the first semiconductor region being provided between the first metal portion and the third electrode in the second direction, wherein no metal member is electrically connecting with the third electrode and the first metal portion, a distance between the first metal portion and the first electrode is shorter than a distance between the first metal portion and the third electrode.

2. The device according to claim 1, wherein the first metal portion is provided inside the first portion and inside the second portion.

3. The device according to claim 1, further comprising a second metal portion provided inside the first portion and inside the second portion, the second metal portion being positioned between the first metal portion and the third electrode.

4. The device according to claim 1, wherein a length in the first direction of the first metal portion is longer than a length in the second direction of the first metal portion.

5. The device according to claim 1, wherein a distance in the second direction between the third electrode and the first metal portion is longer than a distance in the second direction between the first electrode and the first metal portion.

6. The device according to claim 1, wherein a thickness of the other portion of the first semiconductor region in the second direction is greater than a thickness of the portion of the first semiconductor region in the second direction.

7. The device according to claim 1, wherein the third electrode is electrically connected with the first metal portion only via the other portion of the first semiconductor region.

8. The device according to claim 1, wherein a length of the first metal portion in a third direction is longer than a length of the first metal portion in the second direction, the third direction is perpendicular to the first direction and the second direction, a plurality of the first metal portions are provided along the third direction, and the plurality of first metal portions are separated from each other.

* * * * *